United States Patent [19]

Niinomi et al.

[11] Patent Number: 5,070,468
[45] Date of Patent: Dec. 3, 1991

[54] PLANT FAULT DIAGNOSIS SYSTEM

[75] Inventors: Toshihiko Niinomi, Hiroshima; Ryohei Funakoshi, Tokyo; Shigeru Kaseda; Koichi Takahashi, both of Chita, all of Japan

[73] Assignees: Mitsubishi Jukogyo Kabushiki Kaisha; Idemitsu Kosan Company Limited, both of Tokyo, Japan

[21] Appl. No.: 598,770

[22] Filed: Oct. 12, 1990

Related U.S. Application Data

[63] Continuation of Ser. No. 270,356, Nov. 14, 1988, abandoned.

[30] Foreign Application Priority Data

| Jul. 20, 1988 | [JP] | Japan | 63-96201 |
| Jul. 20, 1988 | [JP] | Japan | 63-96202 |
| Jul. 20, 1988 | [JP] | Japan | 63-96203 |
| Oct. 3, 1988 | [JP] | Japan | 63-250596 |

[51] Int. Cl.$^5$ ............................................. G06F 11/32
[52] U.S. Cl. ..................................... 364/550; 395/914
[58] Field of Search .............. 364/550, 551.01, 551.02, 364/513, 500

[56] References Cited

U.S. PATENT DOCUMENTS

| 4,563,746 | 1/1986 | Yoshida et al. | 364/492 |
| 4,628,434 | 12/1986 | Tashiro et al. | 364/130 |
| 4,628,435 | 12/1986 | Tashiro et al. | 364/130 |
| 4,642,782 | 2/1987 | Kemper et al. | 364/550 |
| 4,644,479 | 2/1987 | Kemper et al. | 364/550 |
| 4,648,756 | 10/1987 | Gonzales et al. | 364/557 |
| 4,649,515 | 2/1987 | Thompson et al. | 364/900 |

FOREIGN PATENT DOCUMENTS

| 55-37769 | 9/1974 | Japan . |
| 59-42885 | 1/1979 | Japan . |
| 54-33975 | 3/1979 | Japan . |
| 57-706 | 1/1982 | Japan . |
| 61-251910 | 11/1986 | Japan . |
| 63-12092 | 1/1988 | Japan . |
| 63-12093 | 1/1988 | Japan . |
| 1539549 | 1/1979 | United Kingdom . |

OTHER PUBLICATIONS

Rowan, "Using an Expert System for Fault Diagnosis", 2/87, Control Engineering, CE Forum Section.
Hayes Roth, "The Knownledged-Based Expert System A Tutorial", 9/84, pp. 11-28, IEEE Computer.

Primary Examiner—Thomas G. Black
Attorney, Agent, or Firm—Flynn, Thiel, Boutell & Tanis

[57] ABSTRACT

The present invention relates to a plant fault diagnosing system for diagnosing the operating conditions of the plant, for example, change in the physical quantity or whether any fault is present in each of the instrumentations or not. This system makes reference and makes directly comparison the process data of the plant or a diagnosing pattern processed by treating the process data in a predetermined process with a predetermined information for detecting showing the symptom of an abnormality or a predetermined reference value. When any deviation from a predetermined allowable range or coincidence of the patterns is detected, it determines that there is any abnormality in the plant, and issues an alarm to, for example, an operator.

14 Claims, 30 Drawing Sheets

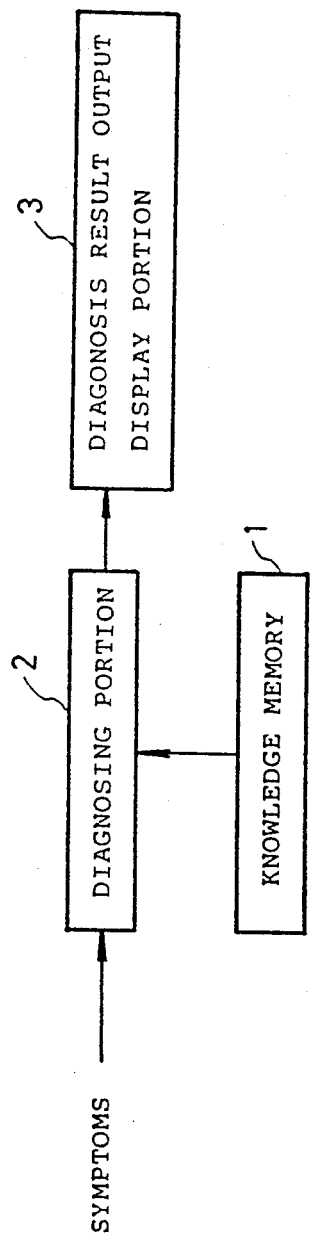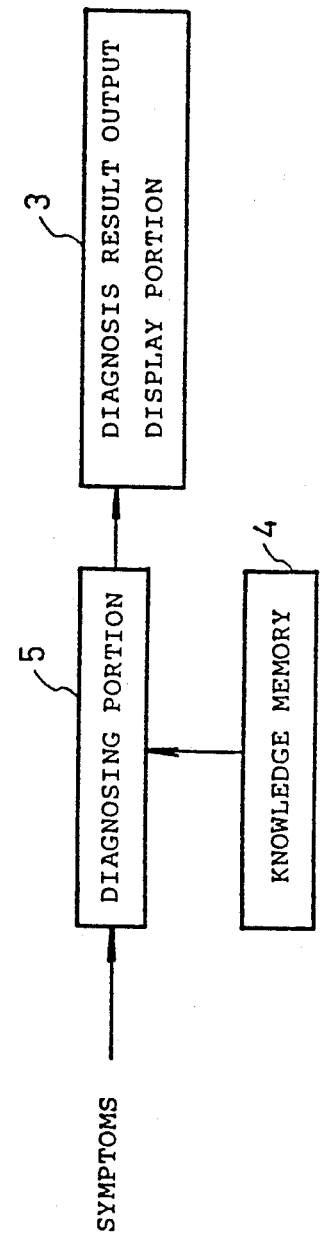

FIG.4

| CLASSIFICATION SYMBOLS | CLASSIFICATION CRITERION |
|---|---|
| A | SYMPTOM NECESSARILY APPEARED WHEN FAULT OCCURS APPEARANCE HYPOTHESIS IS NOT ALLOWED IF ALL OF THE SYMPTOM CLASSIFIED HERE IS NOT DETECTED |
| B | SYMPTOM APPEARED WHEN FAULT OCCURS |
| C | SYMPTOM WHICH CANNOT BE NECESSARILY DETECTED WHEN FAULT OCCURS OR SYMPTOM INVOLVING TIME DELAY |
| D | SYMPTOM HAVING NO RELATIONSHIP WITH HYPOTHESIS OR SYMPTOM WHICH CAN BE AFFIRMED NOT TO BE APPEARED IF THERE IS OTHER HYPOTHESIS HAVING THE SIMILAR TENDENCY IN SYMPTOM APPEARANCE, SYMPTOM WHICH CAN APPEAR RELATING TO THE OTHER HYPOTHESIS, BUT NO CONCERN TO THE SUBJECT HYPOTHESIS ARE CLASSIFIED IN ORDER TO CLARIFY THE OTHER SIMILAR HYPOTHESIS AND THE SUBJECT HYPOTHESIS |

FIG. 5

| NOs<br>SYMPTOM | ① INFLOW INDICATOR 7 HIGH ERRONEOUS VALUE INDICATED | ② INFLOW INDICATOR 7 LOW ERRONEOUS VALUE INDICATED | ③ INFLOW PIPE 6 CLOGGED | ④ LEVEL CONTROLLER 10 HIGH ERRONEOUS VALUE INDICATED | ⑤ LEVEL CONTROLLER 10 LOW ERRONEOUS VALUE INDICATED |
|---|---|---|---|---|---|
| I   INFLOW MEASUREMENT IS HIGH | C | D | D | D | B |
| II  INFLOW MEASUREMENT IS LOW | D | C | C | B | D |
| III LEVEL MEASUREMENT IS HIGH | D | D | D | B | D |
| IV  LEVEL MEASUREMENT IS LOW | D | D | C | C | C |
| V   MANIPULATED VALUE OF LEVEL CONTROLLER IS HIGH | D | D | B | D | B |
| VI  MANIPULATED VALUE OF LEVEL CONTROLLER IS LOW | B | D | D | B | D |
| VII -LEVEL MEASUREMENT) IS HIGH (LEVEL ESTIMATED VALUE | D | B | D | D | B |
| VIII -LEVEL MEASUREMENT) IS LOW (LEVEL ESTIMATED VALUE | A | D | B | B | D |
| IX  -INFLOW MEASUREMENT) IS HIGH (INFLOW ESTIMATED VALUE | D | A | D | D | D |
| X   -INFLOW MEASUREMENT) IS LOW (INFLOW ESTIMATED VALUE | D | A | D | D | D |

FIG. 6

| HYPOTHESIS | ① HIGH ERRORNEOUS VALUE INDICATED FOR INFLOW INDICATOR 7 | |
|---|---|---|
| SYMPTOM NOs | CLASSIFICATION SYMBOLS | REASON |
| I | C | IF THE INDICATIONS HIGH WITH RESPECT TO THE ACTUAL LEVEL, THE ABSOLUTE LEVEL INDICATED IS NOT NECESSARILY BE HIGH DEPENDING UPON THE ACTUAL LEVEL |
| VII | B | AS CAN BE CLEARLY SEEN FROM THE EQUATION 1, WHEN THE LEVEL INDICATED FOR THE INFLOW INDICATOR IS HIGH, THE LEVEL ESTIMATED VALUE BECOMES SLIGHTLY LARGER THAN THE ACTUAL VALUE. SUCH SYMPTOM CAN OCCUR DUE TO OTHER REASON, THEREFORE THIS IS CLASSIFIED AS B |
| IX | A | WHEN THE INDICATED LEVEL FOR THE INFLOW INDICATOR 7 IS HIGHER THAN THE ESTIMATED VALUE FROM THE VALVE OPENED DEGREE, SYMPTOM IX APPEARS |

FIG. 7

| HYPOTHESIS | ② LOW ERRONEOUS VALUE INDICATED FOR INFLOW INDICATOR 7 | |
|---|---|---|
| SYMPTOM NOs | CLASSIFICATION SYMBOLS | REASON |
| II | C | IF THE INDICATED LEVEL IS LOWER THAN THE ACTUAL LEVEL, THE ABSOLUTE LEVEL INDICATED IS NOT NECESSARILY LOW DEPENDING UPON THE ACTUAL LEVEL |
| VIII | B | AS CAN BE CLEARLY SEEN FROM THE EQUATION 1, WHEN THE INDICATED LEVEL FOR THE INFLOW INDICATOR 7 IS LOW, THE LEVEL ESTIMATED VALUE BECOMES SMALLER THAN THE ACTUAL LEVEL |
| X | A | WHEN THE INDICATED LEVEL FOR THE INFLOW INDICATOR 7 IS LOWER THAN THE ESTIMATED VALUE FROM THE VALVE OPENED DEGREE, SYMPTOM X APPEARS |

FIG. 8

| HYPOTHESIS | ③ INFLOW PIPE 6 CLOGGED | |
|---|---|---|
| SYMPTOM NOs | CLASSIFICATION SYMBOLS | REASON |
| II | C | IF THE INFLOW PIPE 6 IS CLOGGED, LEVEL CONTROLLER 10 OPENS INFLOW CONTROL VALVE 8 SO AS TO ADJUST LEVEL OF THE CHAMBER 9 IF THE CLOGGING IS SLIGHT DEGREE. THERFORE OVERALL PRESSURE LOSS COEFFICIENT OF THE INFLOW PIPE 6 IS NOT CHANGED AND THE FLOW RATE IS NOT NECESSARILY REDUCED. |
| IV | C | IF THE INFLOW PIPE 6 IS CLOGGED, LEVEL CONTROLLER 10 ADJUSTS THE LEVEL OF CHAMBER 9 IF THE CLOGGING IS SLIGHT DEGREE, THE LEVEL OF THE CHAMBER 9 IS NOT NECESSARILY AFFECTED |
| V | B | SINCE THE LEVEL CONTROLLER 10 TENDS TO OPEN THE INFLOW CONTROL VALVE 8 IN ORDER TO SECURE THE LEVEL OF THE CHAMBER 9 WHEN THE INFLOW PIPE 6 IS CLOGGED, SYMPTOM V APPEARS |
| IX | B | WHEN THE INFLOW PIPE 6 IS CLOGGED, ACTUAL FLOW RATE IS LOWERED ALTHOUGH THE INFLOW CONTROL VALVE 8 IS OPENED TO A CERTAIN DEGREE. THEREFORE SYMPTOM IX APPEARS. |

FIG. 9

| HYPOTHESIS | ④ HIGH ERRONEOUS VALUE INDICATED FOR LEVEL CONTROLLER 10 | |
|---|---|---|
| SYMPTOM NOs | CLASSIFICATION SYMBOLS | REASON |
| II | B | SINCE LEVEL CONTROLLER 10 SHOWS HIGHER LEVEL THAN THE ACTUAL LEVEL AND THE LEVEL CONTROLLER 10 CLOSES THE INFLOW CONTROL VALVE 8 SO AS TO RESTORE THE APPARENTLY HIGH LEVEL, FLOW RATE OF THE INFLOW PIPE 6 IS LOWERED |
| III | C | DEPENDING UPON THE DEGREE OF ERRONEOUS INDICATION, THE INDICATED LEVEL IS NOT NECESSARILY HIGH. HOWEVER, THIS HYPOTHESIS NEEDS TO BE CONSIDERED WHEN INDICATION THAT THE LEVEL IS HIGH IS ISSUED |
| VI | B | SINCE LEVEL CONTROLLER 10 SHOWS HIGHER LEVEL THAN THE ACTUAL LEVEL AND THE LEVEL CONTROLLER 10 CLOSES THE INFLOW CONTROL VALVE 8 SO AS TO RESTORE THE ARRAPENTLY HIGH LEVEL. |
| VIII | B | SINCE INDICATED LEVEL FOR THE LEVEL CONTROLLER BECOMES HIGHER THAN THE ACTUAL LEVEL, SYMPTOM VIII APPEARS |

FIG. 10

| HYPOTHESIS SYMPTOM NOs | ⑤ LOW ERRONEOUS VALUE INDICATED FOR LEVEL CONTROLLER 10 | |
|---|---|---|
| | CLASSIFICATION SYMBOLS | REASON |
| I | B | SINCE LEVEL CONTROLLER 10 SHOWS LOWER LEVEL THAN THE ACTUAL LEVEL AND THE LEVEL CONTROLLER 10 TENDS TO OPEN THE INFLOW CONTROL VALVE 8 SO AS TO RESTORE THE APPARENTLY LOW LEVEL, FLOW RATE OF THE INFLOW PIPE 6 IS INCREASED |
| IV | C | DEPENDING UPON THE DEGREE OF ERRONEOUS INDICATION, THE INDICATED LEVEL IS NOT NECESSARILY LOW. HOWEVER, THIS HYPOTHESIS NEEDS TO BE CONSIDERED WHEN INDICATION THAT THE LEVEL IS LOW IS ISSUED |
| V | B | SINCE LEVEL CONTROLLER 10 SHOWS LOWER LEVEL THAN THE ACTUAL LEVEL AND THE LEVEL CONTROLLER 10 TENDS TO OPEN THE INFLOW CONTROL VALVE 8 SO AS TO RESTORE THE APPARENTLY LOW LEVEL. |
| VII | B | SINCE INDICATED LEVEL FOR THE LEVEL CONTROLLER BECOMES LOWER THAN THE ACTUAL LEVEL, SYMPTOM VII APPEARS |

FIG. 11

| NOs | HYPOTHESIS / SYMPTOM | ① INFLOW INDICATOR 7 HIGH ERRONEOUS VALUE INDICATED | ② INFLOW INDICATOR 7 LOW ERRONEOUS VALUE INDICATED | ③ INFLOW PIPE 6 CLOGGED | ④ LEVEL CONTROLLER 10 HIGH ERRONEOUS VALUE INDICATED | ⑤ LEVEL CONTROLLER 10 LOW ERRONEOUS VALUE INDICATED |
|---|---|---|---|---|---|---|
| I | INFLOW MEASUREMENT IS HIGH | C | D | D | D | D |
| II | INFLOW MEASUREMENT IS LOW | D | C | B | D | D |
| III | LEVEL MEASUREMENT IS HIGH | D | D | D | C | D |
| IV | LEVEL MEASUREMENT IS LOW | D | D | B | D | C |
| V | MANIPULATED VALUE OF LEVEL CONTROLLER IS HIGH | D | D | D | D | D |
| VI | MANIPULATED VALUE OF LEVEL CONTROLLER IS LOW | B | D | D | D | D |
| VII | (LEVEL ESTIMATED VALUE) −(LEVEL MEASUREMENT) IS HIGH | D | B | D | D | B |
| VIII | (LEVEL ESTIMATED VALUE) −(LEVEL MEASUREMENT) IS LOW | A | D | B | B | D |
| IX | (INFLOW ESTIMATED VALUE) −(INFLOW MEASUREMENT) IS HIGH | D | D | D | D | D |
| X | (INFLOW ESTIMATED VALUE) −(INFLOW MEASUREMENT) IS LOW | D | A | D | D | D |

FIG.12

| HYPOTHESIS | ③ INFLOW PIPE 6 CLOGGED (WHEN LEVEL CONTROLLER 10 IS NOT PERFORMING ADJUSTMENT) | |
|---|---|---|
| SYMPTOM NOs | CLASSIFICATION SYMBOLS | REASON |
| II | B | SINCE THE OVERALL PRESSURE LOSS OF THE INFLOW PIPE 6 IS ENLARGED DUE TO CLOGGING OF THE INFLOW PIPE 6, THE INFLOW RATE IS DECREASED |
| IV | B | SINCE THE FLOW RATE OF THE INFLOW PIPE 6 IS DECREASED DUE TO CLOGGING OF THE INFLOW PIPE 6, THE LEVEL OF THE CHAMBER 9 IS DECREASED |
| IX | B | SINCE THE ACTUAL FLOW RATE IS LOWERED ALTHOUGH THE INFLOW CONTROL VALVE 8 IS OPENED BY A CERTAIN DEGREE WHEN THE INFLOW PIPE 6 IS CLOGGED, SYMPTOM IX APPEARS |

FIG. 13

④ HIGH ERRONEOUS VALUE IS INDICATED FOR LEVEL CONTROLLER 10 (WHEN LEVEL CONTROLLER 10 IS NOT PERFORMING ADJUSTMENT)

| HYPOTHESIS | | |
|---|---|---|
| SYMPTOM NOs | CLASSIFICATION SYMBOLS | REASON |
| II | C | DEPENDING UPON THE DEGREE OF THE ERRONEOUS INDICATION, THE INDICATED LEVEL IS NOT NECESSARILY HIGH |
| VIII | B | SINCE THE INDICATION FOR THE LEVEL CONTROLLER BECOMES HIGHER THAN THE ACTUAL LEVEL, SYMPTOM VIII APPEARS |

FIG. 14

| HYPOTHESIS | ⑤ LOW ERRONEOUS VALUE IS INDICATED FOR LEVEL CONTROLLER 10 (WHEN LEVEL CONTROLLER 10 IS NOT PERFORMING ADJUSTMENT) | | |
|---|---|---|---|
| SYMPTOM NOs | CLASSIFICATION SYMBOLS | REASON | |
| IV | C | DEPENDING UPON THE DEGREE OF THE ERRONEOUS INDICATION, THE INDICATED LEVEL IS NOT NECESSARILY LOW | |
| VII | B | SINCE THE INDICATION FOR THE LEVEL CONTROLLER BECOMES LOWER THAN THE ACTUAL LEVEL, SYMPTOM VII APPEARS | |

FIG. 18

| FAILURE | DIAGNOSIS RESULT |
|---------|------------------|
| 1 | SUBJECT FAULT IS NOT APPEARD AT PRESENT |
| 2 | SUBJECT FAULT IS APPEARD AT PRESENT |
| 3 | ALTHOUGH A FACT THAT FAULT IS APPEARD IS DETERMINED, THE ESTIMATED PROCESS VALUE OF THE FAILED INSTRUMENT DURING DIAGNOSIS PROCESS IS USED. PAY ATTENTION |
| 4 | ALTHOUGH A FACT THAT FAULT IS NOT APPEARD IS DETERMINED, THE ESTIMATED PROCESS VALUE OF THE FAILED INSTRUMENT DURING DIAGNOSIS PROCESS IS USED. PAY ATTENTION |
| 5 | SINCE THE INSTRUMENT FOR MEASURING PROCESS VALUE FOR USE IN DIAGNOSIS FOR THE SUBJECT FAULT IS DETECTED, DIAGNOSIS RESULT CANNOT BE ISSUED |

FIG. 25

| IMPORTANCE FACTOR | IMPORTANCE FACTOR CLASSIFICATION SYMBOLS | CLASSIFICATION CRITERIA |
|---|---|---|
| HIGH ↕ LOW | A | THERE IS A PROBABILITY OF CRITICAL BREAKAGE OF APPARATUS |
| | B | THERE IS A PROBABILITY OF PARTIAL BREAKAGE OF APPARATUS |
| | C | ALTHOUGH APPARATUS CANNOT BE BROKEN, GREAT CHANGE OR DETERIORATION OF THE PRODUCT QUALITY CAN OCCUR |
| | D | ALTHOUGH APPARATUS IS NOT BROKEN AND THE PRODUCT QUALITY MAY NOT BE DETERIORATED, MINOR CHANGE CAN OCCUR |

FIG.26

| IMPORTANCE FACTOR CLASSIFICATION SYMBOLS | A | B | C | D |
|---|---|---|---|---|
| LESS THAN 0 MINUTE | 1 | 2 | 3 | 4 |
| OVER 0 MINUTE AND LESS THAN 5 MINUTES | 2 | 3 | 4 | 5 |
| OVER 5 MINUTES AND LESS THAN 10 MINUTES | 3 | 4 | 5 | 6 |
| OVER 10 MINUTES AND LESS THAN 15 MINUTES | 4 | 5 | 6 | 7 |

FLOATING TIME

1 : URGENCY FACTOR HIGH
$\sim$
7 : URGENCY FACTOR LOW

PLANT FAULT DIAGNOSIS SYSTEM

This application is a continuation of U.S. Ser. No. 07/270356, filed Nov. 14, 1988, now abandoned.

BACKGROUND OF THE INVENTION

1. Field of the Invention

This invention relates to a plant fault diagnosis system capable of diagnosing fault or failures and applied to a large scale plant such as chemical plants.

2. Description of the Related Art

Hitherto, a diagnosis system for diagnosing faults and failures generated at plants has a function capable of detecting a fault generated in a process of the plant and provided with a predetermined threshold upon the process value, whereby a fact that the process value deviates from the threshold is notified as an alarm to operators.

However, with the above-described type of method, when a fault is generated in a process and the disturbance of the process is propagated, the number of alarms increase. Therefore, it becomes very difficult for the operator to acknowledge the type of the fault generated in the process and the cause thereof. To this end, as means to overcome the above-described type of problem, a method is known in which the number of alarms are reduced by displaying the logical product of a plurality of these alarms which are considered to represent the same information as the representative value of the alarms. Another known method is such that the way to display the critical alarm is distinguished from general alarms.

However, according to the above-described technology, even if any fault is detected in a process, only detected is the disturbance generated in the process. Therefore, the cause for the faults cannot be identified. A method can be considered to identify the cause of a fault by a pattern matching way such that the alarm items expected to be generated in accordance with the causes for faults are previously picked up and the logical product thereof is used. However, with this method, all of the alarms need to be issued in the same form to identify the cause. That is, a problem arises that the cause cannot be detected if this type of alarm cannot be detected in a case where the pattern matching method is applied to the alarm of a poor probability to be detected such as an alarm representing the disturbance degree of the process value is too small and a certain time delay is expected to occur from generation of the fault to detection of it.

A plurality of instruments such as pressure gauges and differential pressure gauges provided for chemical plants or the like are critical instruments for acknowledging the state of the operating condition of the plants. Although these instruments need to always work accurately, they can generate erroneous indications due to an indication level hold and a deviation after they have been used for a long time period. Hitherto, since means to automatically detect such fault of the instruments have not been available, it needs to depend upon the detecting means of human power of the operators. That is, the operator performs a fault detection by way of detecting the erroneous indication of the instruments after they have checked the indicated levels by the instruments from the fault state through the plant, or after they have made a comparison the indicated levels to those of the field instruments.

However, a problem arises that a quick and proper fault detection cannot be performed if such detection depends upon the operator's human power. As a result of this, it is feared that, for example, although the pressure of a plant is at the abnormal level, the erroneous indication shown on the instrument causes the operator to determine that the pressure is in the normal range. It leads to a fact that an early detection of the faults in the plant cannot be performed. On the contrary, it as well feared that although the pressure is in the normal range, the erroneous indication shown on the instrument causes the determination of the abnormal pressure. As a result of this, there is the possibility of performing erroneous operation.

As a means for diagnosing fault in the plant there are off-line fault diagnosing systems in which fault diagnosing is performed by inputting process data of the plant in off-line-input, and on-line fault diagnosing system in which the data is on-line-input. Process data to be input to the types of diagnosing systems are, without exception, measured by the corresponding instruments. In an off-line system, the result of field reading the indication is manually input, while in an on-line system, data is input through signal lines. However, for example, in chemical plants, the terminate end of the detecting portion of the instrument is corroded due to the characteristics of the subject to be treated or clogging can be generated. In the instruments having movable portions, the movable portions can be caught or the like, causing for the normal working to be prevented.

As described above, in a great size plants such as chemical plants, if the fault diagnosing is performed by using the process value of the defected instruments, fault generation can be detected although any fault is not generated, causing for an alarm or the like to be erroneously issued. Such erroneous indication causes for operators to become needless confusion, and is unfavorable on the viewpoint of operating plants.

At the time of performing plant instrumentation, the upper limit and the lower limit of the normal operation range with respect to each of the processes are provided and a device for issuing an alarm when the process value deviates from the above normal operation limits is installed for the purpose of preventing generation of breakdowns due to generation of faults at the time of instrumentation.

When a fault is generated in the instruments of a chemical plant, the local disturbance successively propagates to other portions widely. As a result of this, only a sole failure affects so many process values. It needs to identify the cause of the generation of the fault so as to remove it, but it is also important to maintain each of the disturbed process values within a safety range. The reason for this lies in that entering of the disturbed process value due to the original failure into the unfavorable range can cause another failures. If a multiplicity of process value disturbance are simultaneously generated, it needs to select the disturbance of the process value capable of causing a critical failure from a large number of alarms so as to preferentially act to overcome the critical failure.

Therefore, in the instrumentation of chemical plants, systems were disclosed with which an alarm is issued real timely for notifying the generation of a fault by performing a fault diagnosis with computers. In these alarm systems, a plurality of alarms are issued for each process to which the disturbances are propagated and, in order to select the process value capable of causing a critical failure from each of the process values which have generated disturbances, a classification is employed such as that, for example, the color of the alarm displaying lamp is classified in accordance with the degree of importance factor.

However, the alarm systems of the type as described above confront the following problems.

That is, such systems notify a fact that an abnormal state was generated in the instrumentation of the chemical plant after this state has occurred, but these systems cannot issue alarms previously by detecting a fact that the process value is now deviating from a normal range. Therefore, it arises a problem that an action to overcome the abnormality in a chemical plant is caused to be too much delayed.

On the other hand, a method can be employed in which the upper and lower limits of the process value are provided in a further safety range so that a fault is detected in an early stage. However, there is the probability of issuing an erroneous information depending upon a determination of fault although the state is normal.

Furthermore, the alarms are selected only on the basis that the importance factor of the fault of the chemical plant generated from deviation from a normal range of the process value, but selection of issue of the alarms in accordance with a floating time (marginal time) taken to reach the generation of the fault is not considered. As a result of this, although there is insufficient floating time to generation of a fault, and although the importance factor of such fault is critical, no alarm is not issued, causing a fault.

Furthermore, a conventional plant fault diagnosing system is known in which the physical quantity of each of the portion in a plant is always measured with sensors for the purpose of issuing an alarm when the physical quantity or its change rate is excessively different from the value at the normal operation sate of the plant.

However, in these type of plant fault diagnosing systems confront the following problems.

Since the allowable range for the physical quantity is arranged such that the physical quantity can be present applicable to all of the operation conditions of the plant, the allowable range needs to be arranged large. In such case, a certain long time is taken from generation of a fault in the plant to issue of an alarm, and it becomes a cause for the successive generation of faults in each of the portions in the plant. As a result of this, an excessive long time period is taken to recover the fault.

When an alarm is set for the change rate, such setting can cause alarm issue depending upon a determination of generation of the fault although the state cannot actually be determined that the fault occurred. That is, an alarm can be issued relatively earlier from the start of the physical quantity change due to generation of the fault, however, the alarm is obliged to be issued even if the measured value contains a disturbance such as noise or when the physical quantity changes slightly.

Furthermore, since the number of points at which the physical quantity is measured is large in the plant instrumentation, it takes too much labor for operators to completely and manually determine the allowable range of the fluctuation with respect to the value at the time of normal operation.

SUMMARY OF THE INVENTION

A first object of the present invention is to provide a plant fault diagnosing system capable of notifying operators the types and causes of the generated fault when it occurs.

In order to achieve the above-described object, a preferred embodiment comprising: a knowledge memory for storing information for detecting faults or the like for storing the corresponding relationship between a hypothesis that a failure or a fault sate is generated and symptoms caused to appear when the hypothesis is occured in such a manner that the corresponding relationship is classified depending upon the possibility of appearance of the symptom corresponding to each hypothesis or intensity of the detection of the same and symptoms which cannot be appeared: a diagnosing portion to which data representing the symptoms which are now being appeared in the plant is input and capable of determining whether each hypothesis is occured or not by collating the data with the contents written in the knowledge memory; and notifying means for notifying the diagnosis result from this diagnosing portion, whereby the type and the cause of the fault can be displayed to operators so that even if the appearance possibility of the symptoms are different, a proper determination can be performed in accordance with the classification of the symptoms.

A second object of the present invention is to provide a plant fault diagnosing system capable of informing generation of an instrument failure and preventing an erroneous information due to the failure for the purpose of protecting operators form needless confusion.

In order to achieve the second object, the preferred embodiment comprises: an instrument failure diagnosing portion for diagnosing a failure of each of instrument, the instrument failure being diagnosed on the process data in the plant; a general fault diagnosing portion for diagnosing abnormalities other than the failures of the instrument, the general fault being diagnosed on the result in the instrument failure diagnosing portion and the process data; and a notifying portion for notifying the diagnosis result of the general fault diagnosing portion and the diagnosis result of the instrument failure diagnosing portion, wherein the general fault diagnosing portion displays the failure when the failure is detected by the instrument failure diagnosing portion, and as well performing abnormal diagnosis by removing the process values of the instrument in which the failure is detected from the process data, whereby the failure is notified when the failure of the instrument is detected, and abnormal diagnosis is performed by removing the process value of the subject instrument from the process data so that needless confusion of the operators can be avoided by preventing the erroneous information due to the failure of the instrument.

A third object of the present invention is to provide a plant fault diagnosing system capable of issuing an alarm before occurrence of an abnormality by detecting a fact that the process value in an instrumentation of a chemical plant is now deviating from a normal range, and as well capable of issuing alarms successively in accordance with a fault having poor floating time or in accordance with the urgency factor degree considering floating time and importance factor.

In order to achieve the third object, a preferred embodiment comprising: a memory for storing the importance factor when each alarm depending upon alarm factors included in information for detecting faults or the like and also for outputting the importance factor to the diagnosing portion is juxtaposed to the diagnosing portion, wherein the diagnosing portion including means for estimating the time taken to generation of each abnormal state depending upon the physical quantity of the data, means for estimating the time required to avoid an abnormal state, means for calculating an estimated floating time required for avoidance operation in such a manner that an estimated avoidance required time is subtracted from an estimated abnormality generation time obtained by the means, and means for calculating urgency factor using the estimated floating time and the importance factor, whereby the notifying means is constituted in such a manner that it is capable of ranking and displaying the abnormalities in the sequential order upon the intensity of the urgency factor, and as well ranking and displaying the same in the sequential order upon the floating time. As a result of this, when any abnormality is generated in the plant, the faults having high urgency factor and having short floating time can be taken a measure required in each portion of the plant.

A fourth object of the present invention is to provide a plant fault diagnosing system capable of early detecting a fault in accordance with the state where the plant is operated, and from which a reliable alarm without limited erroneous information can be obtained.

In order to achieve the fourth object, a preferred embodiment is characterized in that the changeable reference value comprises an average value obtained by using an average calculator which is juxtaposed to the diagnosing portion, this average value being obtained at a predetermined time interval of the physical quantity at specific points in the plant which is the data, wherein the notifying means issues an alarm when the difference between the average value and the physical quantity deviates from a predetermined allowable range, and the average value is arranged not to be renewed during a period where the alarm is being issued. As a result of this, even if the value of the physical quantity is slightly changed due to the conditions such as outside temperature or the like, a stable value corresponding to the process change through a long time period can be determined by re-calculating the average value at a proper time period intervals.

BRIEF DESCRIPTION OF THE DRAWINGS

FIG. 1 is a block diagram illustrating a first embodiment of the present invention;

FIG. 2 is a block diagram illustrating a modified example of the former;

FIG. 4 is a view illustrating a classification criterion of a knowledge memory;

FIG. 5 is a view illustrating the relationship between hypothesis stored in the knowledge memory and the state of the appeared symptom;

FIG. 6 to 14 illustrate knowledge examples for each hypothesis;

FIG. 18 illustrates a displayed example of the failure points and the diagnosis result according to the second embodiment;

FIG. 25 illustrates a classification criterion of importance factor memory;

FIG. 26 illustrates the degree of urgency factor;

DETAILED DESCRIPTION OF THE PREFERRED EMBODIMENT

Figure 3:
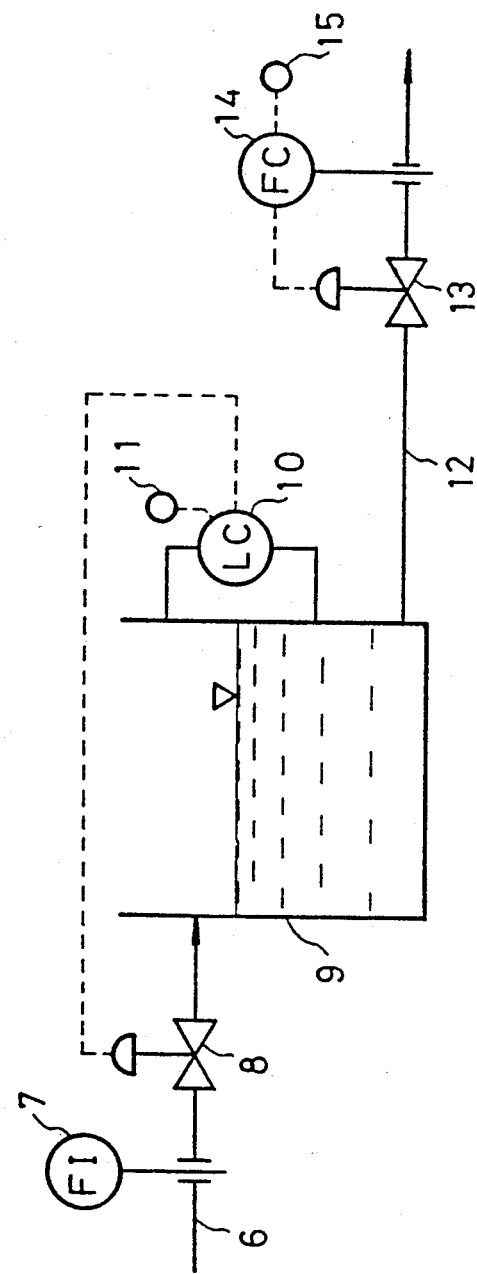
FIG. 3 is a view illustrating a specific applied example of the above-described embodiment.

Referring to FIG. 1 showing a first embodiment of the present invention, reference numeral 1 represents a knowledge memory which stores information for detecting such as faults for storing the corresponding relationship between a hypothesis that a failure or a fault state is generated in a plant and a symptom caused to appear when the hypothesis is generated in such a manner that the corresponding relationship is classified to the depending upon the possibility of appearance of the symptom corresponding to each of the hypothesis or intensity of the detection of the same and the symptoms which can not be appeared. Reference numeral 2 represents a diagnosing portion for performing a diagnosis whether each hypothesis actually is generated or not by way of inputting diagnosing patterns corresponding to the now-appearing fault state, these diagnosing patterns being able to be obtained in accordance with the process data supplied from each of the instruments in the plant. The diagnosing portion performs the diagnosis by way of further performing collation of the thus-input symptom appeared state, information on the non-appeared symptom, the relationship between the hypothesis stored in the knowledge memory 1 and the appeared symptom state, and the non-appeared symptom. Reference numeral 3 represents an output display portion to serve as means for notifying the diagnosis result of the diagnosing portion 2.

As the diagnosis logic in the diagnosing portion 2, a variety of information industrial methods such as that depending upon the certainty factor can be employed. The description "appearance and detection possibility" in the classification criterion in the knowledge memory 1 is an index representing a fact that the magnitude of the disturbance of the process value during generation of the fault is large enough to be detected, or the symptom is suitable to be used for diagnosis since any long time delay or the like cannot be generated from generation of the fault to the appearance of the symptom. For example, the symptom classified to have a high appearance or detection possibility is connected, by way of being detected, to the determination in the diagnosing portion 2 that "a corresponding hypothesis is generated", while the same is connected to the determination in the diagnosing portion 2 that "corresponding hypothesis is not generated".

The symptom classified to have a low appearance or detection possibility is connected to, by way of being detected, the determination in the diagnosing portion 2 that "corresponding hypothesis is generated". However, even if the same is not detected, it cannot be connected to the determination in the diagnosing portion 2 that "corresponding hypothesis is not generated".

In the classification criterion in the knowledge memory 1, the description "non-appeared symptom" represents a fact that appearance of such symptom due to the effect of the hypothesis cannot be considered from the physical properties of the plant. The symptom classified to be a non-appeared symptom state is connected to, by way of being detected, the determination the diagnosing portion 2 that "corresponding hypothesis is not generated".

As described above, the relationship between a hypothesis that a failure or a fault is generated in the plant and the symptom appearing at the time of generation of the hypothesis is classified in accordance with the magnitude of appearance or the detection possibility with respect to each hypothesis and the non-appeared symptoms so as to have it stored in the knowledge memory 1. On the other hand, the symptom which is now appearing in the plant is input to the diagnosing portion 2 so as to perform diagnosis by collation with the contents written in the knowledge memory 1 and perform determination whether each hypothesis is generated or not. As a result of this, the type and the cause of the generation of the fault can be informed the operator so that the operator can properly determine in accordance with the classification of the symptom even if the appearance possibility is different.

Next, an modified example of the above-described first embodiment will now be described with reference to FIG. 2. Referring to this figure, reference numeral 4 represents an knowledge memory, and reference numeral 5 represents a diagnosing portion. The portions which are the same as those shown in FIG. 1 are given the same reference numerals and the description for the same is omitted. In order to distinguish the knowledge memory 1 and the diagnosing portion 2 in the above-described embodiment from the knowledge memory 4 and the diagnosing portion 5 in this modified example, the knowledge memory 1 and the diagnosing portion 2 in the above-described embodiment are arranged to be a first knowledge memory and a first diagnosing portion, respectively, while the knowledge memory 4 and the diagnosing portion 5 in this modified example are arranged to be a second knowledge memory and a second diagnosing portion, respectively.

The second knowledge memory 4 according to this modified example stores the relationship between the hypothesis that a failure or fault is generated in the plant and the symptom appeared at the time of generation of the hypothesis, the relationship being classified in accordance with the plant conditions. The diagnosing portion 5 collates the written contents in the second knowledge memory 4, selects the most suitable relationship from the written contents, and makes a comparison with the symptom which is now appeared in the plant, whereby the fault diagnosis is performed. Therefore, with this modified example, the cause of the fault can be properly displayed even if the symptom pattern at the time of fault generation is changed in accordance with the conditions.

FIG. 3 illustrates a liquid level control system for a chamber used in chemical plants. Next, a case where the first embodiment is applied to the plant shown in this figure will be described. Referring to FIG. 3, reference numeral 6 represents an inflow pipe, reference numeral 7 represents an inflow indicator for measuring the flow rate of the fluid passing through the inflow pipe 6. Reference numeral 8 represents an inflow control valve for controlling the flow rate of the fluid passing the inflow pipe 6, and reference numeral 9 represents a chamber for accumulating the fluid passing through the inflow pipe 6. Reference numeral 10 represents a level controller for measuring the fluid level in the chamber 9 and outputting a control signal to the inflow control valve 8 so as to secure the fluid level at the predetermined level. Reference numeral 11 represents a predetermined value set for the level controller 10. Reference numeral 12 represents an discharge pipe for taking out the fluid in the chamber 9. Reference numeral 13 represents a control valve for controlling the flow rate of the fluid passing through the discharge pipe 12. Reference numeral 14 represents a discharge indicator for measuring the flow rate in the discharge pipe 12 and outputting a control signal to the control valve 13 so as to secure the flow rate at a predetermined value, and reference numeral 15 represents a set value for the discharge indicator 14.

In the thus-constituted plant, the following symptoms can be detected by using various conventional instrumentation systems and computers:

I. The level indicated for the inflow indicator 7 is high.
II. The level indicated for the inflow indicator 7 is low.
III. The level indicated for the level controller 10 is high.
IV. The level indicated for the level controller 10 is low.
V. The control signal for the level controller 10 is high (in this case, the inflow control valve 8 is operated to the open side).
VI. The control signal for the level controller 10 is low (in this case, the inflow control valve 8 is operated to the close side).
VII. The value subtracting the indicated level for the level controller 10 from the level estimated value is high, wherein, the "level estimated value" is the level estimated in the chamber 9 by time-integrating the difference between the indicated level for the inflow indicator 7 and the indicated level for the discharge indicator 14 so as to estimate the retained quantity of the fluid in the chamber 9 so that the level in the chamber 9 corresponding to the retained fluid quantity depending upon the geometric shape of the chamber 9. This "level estimated value" can be expressed by the following equation:

$$Lg(t) = LM \left( \int_{T-\tau}^{t} (FI(t) - FC(t))dt + M_{T-\tau} \right) \quad (1)$$

wherein,
Lg(t): level estimated value
t: time
FI(t): indicated level for inflow indicator 7
FC(t): indicated level for discharge indicator 14
$M_{T\tau}$: level of the retained fluid quantity in the chamber 9 at the time $T-\tau$
$\tau$: integrating time
T: present time
LM: function (monotone increasing function) for obtaining the level in the chamber 9 from the retained fluid quantity in the chamber 9 and its geometric shape.

VIII. Indication of level for the level controller 10 subtracting from the level estimated value is low.
IX. Indication of level for the inflow indicator 7 subtracting from the inflow estimated value is high, wherein the "inflow estimated value" is a value obtained by estimation from the physical relationship between the open degree of the inflow control valve 8 and the flow rate of the fluid passing through the inflow pipe 6, and the open degree of the inflow control valve 8 is replaced by a manipulated signal for the level controller 10. The inflow estimated value can be expressed by the following equation:

$$FIg = Cvi(Mi)\sqrt{dPi} \qquad (2)$$

wherein

FIg: inflow estimated value

Mi: manipulated signal for operating the inflow control valve 8

Cvi(Mi): flow rate coefficient of the inflow control valve 8 (the flow rate coefficient becomes the function of the operating signal, and is a monotone increasing function)

dPi: the pressure difference of the flow inflow control valve 8 (it is assumed to be constant, here).

X. Indication of level for the inflow indicator 7 subtracting from the inflow estimated value is low.

The above-described symptoms I to X are shown as an example, and the items are not limited to one meaning. A variety of symptoms can be selected as needed in accordance with the method of writing knowledge to be described hereinafter.

In this embodiment, the hypothesis of the cause of the fault subjected to diagnosis is assumed as follows:

① high erroneous value indicated for the inflow indicator 7 (higher value is indicated than the actual quantity passing through the inflow pipe 6)

② erroneous value indicated for the inflow indicator 7 (lower value is indicated than the actual quantity passing through the inflow pipe 6)

③ inflow pipe 6 is clogged

④ high erroneous value indicated for the level controller 10 (higher value is indicated than the actual fluid level)

⑤ low erroneous value indicated for the level controller 10 (lower value is indicated than the actual fluid level)

⑥ leakage from the chamber 9.

The classification of the symptoms in accordance with the appeared state is determined as shown in FIG. 4, and knowledge corresponding to the appeared symptoms due to generation of faults and its grounds in the first knowledge memory 1 about the hypothesis will now be described. In the following description, each hypothesis will be successively described by using the classification symbols and the symptom numbers shown in FIG. 4. However, the non-appeared symptom classification D includes the symptoms other than the classification symbols A, B, and C. It is, of course employed, that other symptoms can be classified in D by the limited numbers in order to distinguish other hypothesis. Knowledge obtained as a result is shown in FIG. 5, and the knowledge examples in the hypothesis ① to ⑤ are respectively shown in FIGS. 6 to 10.

Knowledge corresponding relationship to symptom appearance due to generation of faults in the above-described knowledge memory 4 and its ground will now be described. In the second knowledge memory 4, the written contents in the first knowledge memory 1 are stored after they have been classified in accordance with the various conditions. In the subject plant shown in FIG. 3, as the condition, two conditions are assumed, the two conditions being such that whether control of the level controller 10 is performed or its control is released. The knowledge in a case where the control of the level controller 10 is performed is shown in FIGS. 6 to 10. Therefore, the knowledge in a case where the control of the level controller 10 will now be described. The knowledge when the control of the level controller 10 obtained as a result is shown in FIG. 11, and examples of knowledge for the hypothesis ③~⑤ are shown in FIGS. 12 to 14, respectively.

Figure 15:
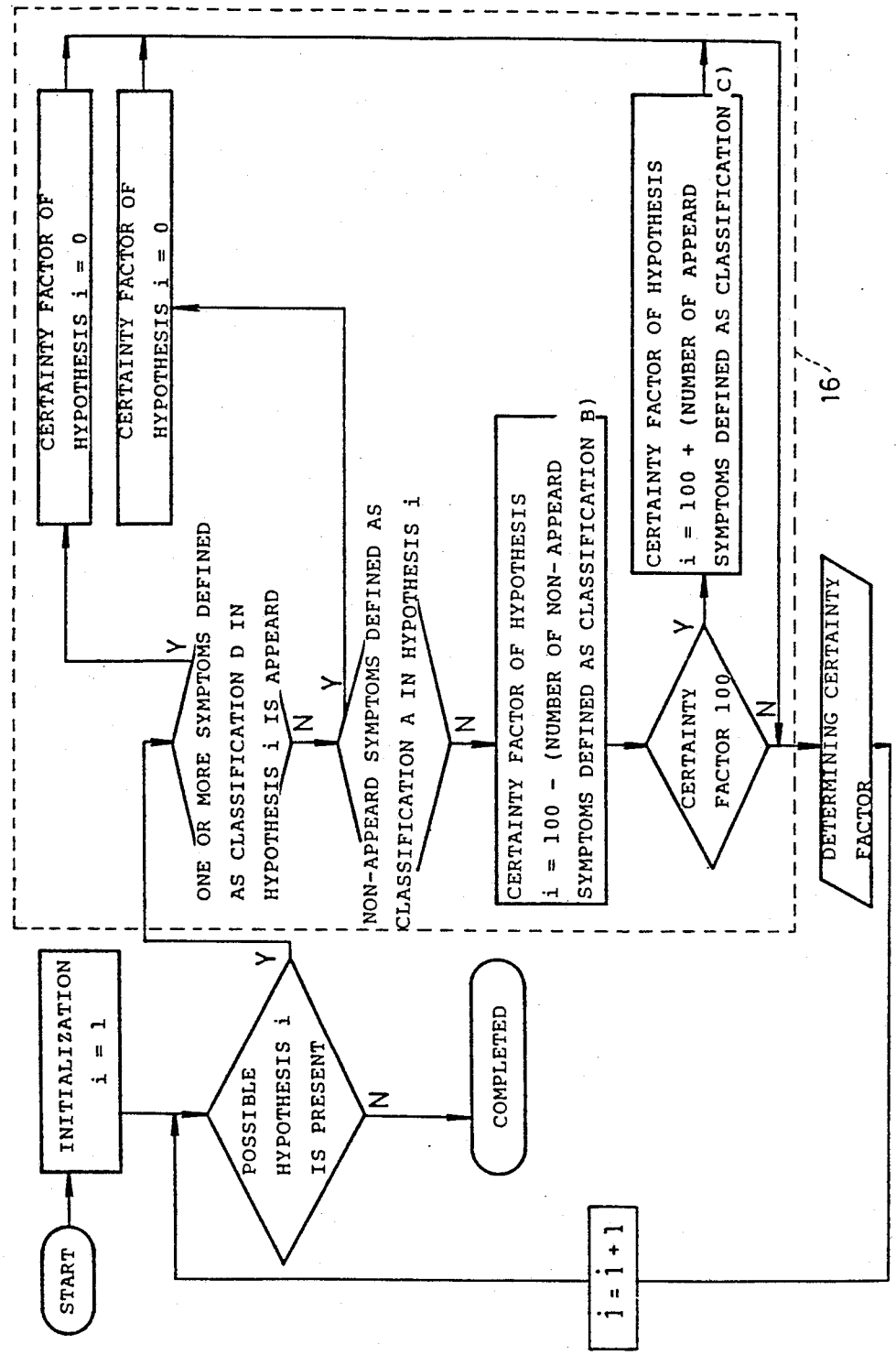
FIG. 15 illustrates a process flow of the diagnosing portion of the first embodiment.

FIGS. 15 shows a treatment flow when the treatment in the first diagnosing portion 2 is performed with a computer. Referring to this figure, reference numeral 16 represent a certainty factor determining logic for each hypothesis. In the first embodiment, the first diagnosing portion 2 performs fault diagnosis by calculating the certainty factor that a hypothesis is generated. In a case where the certainty factor is 100 or more is arranged to be the case where hypothesis generation is determined, while the same is arranged to be a candidate when it is less than this value. The more the certainty factor is large, the more the probability of generation of the hypothesis increases. When the certainty becomes zero, the hypothesis is considered to be completely abolished. In FIG. 15, the first diagnosing portion 2 performs the following treatment upon the all of the hypothesis stored in the knowledge memory 1:

(a) If one or more symptoms defined as the classification symbol D is appeared, the certainty factor of the subject hypothesis is zero, (b) if any symptom defined as the classification symbol A is not appeared, the certainty factor of the hypothesis is zero, and (c) if a hypothesis in which the certainty factor is not zero after through the treatments (a) and (b) but all of the symptoms defined as the classification symbol B are appeared, its certainty is 100. In a case where there is non-appeared symptoms, the certainty factor is obtained by subtracting the number of the non-appeared symptoms from 100, and the calculation result becomes less than zero, its certainty factor is zero, (d) in the hypothesis in which the certainty factor of the hypothesis is 100 after through the above-described treatments (a) to (c), if there is a symptom defined as the classification symbol C, its certainty factor is increased by 10.

After the treatment (a) has been performed, the hypothesis in which "irrational appearance of symptom" classified in classification D is appeared is abolished. The hypothesis in which "symptom necessarily to be appeared" classified in classification A is not generated after through the treatment (b) is abolished. When all of the symptoms considered to be appeared classified in classification B in the treatment (c) are generated, the hypothesis is determined to be correct. As the number of the appeared symptoms is reduced by one, its certainty factor is decreased. When the hypothesis which has been resulted to be generation by the action of the treatment (c) confronts the appearance of the "symptom which are not necessarily detected, but its affection can be considered due to the structure of the process", generation of the hypothesis can be resulted with an intense certainty factor by the treatment (d) by using the certainty factor.

Figure 16:
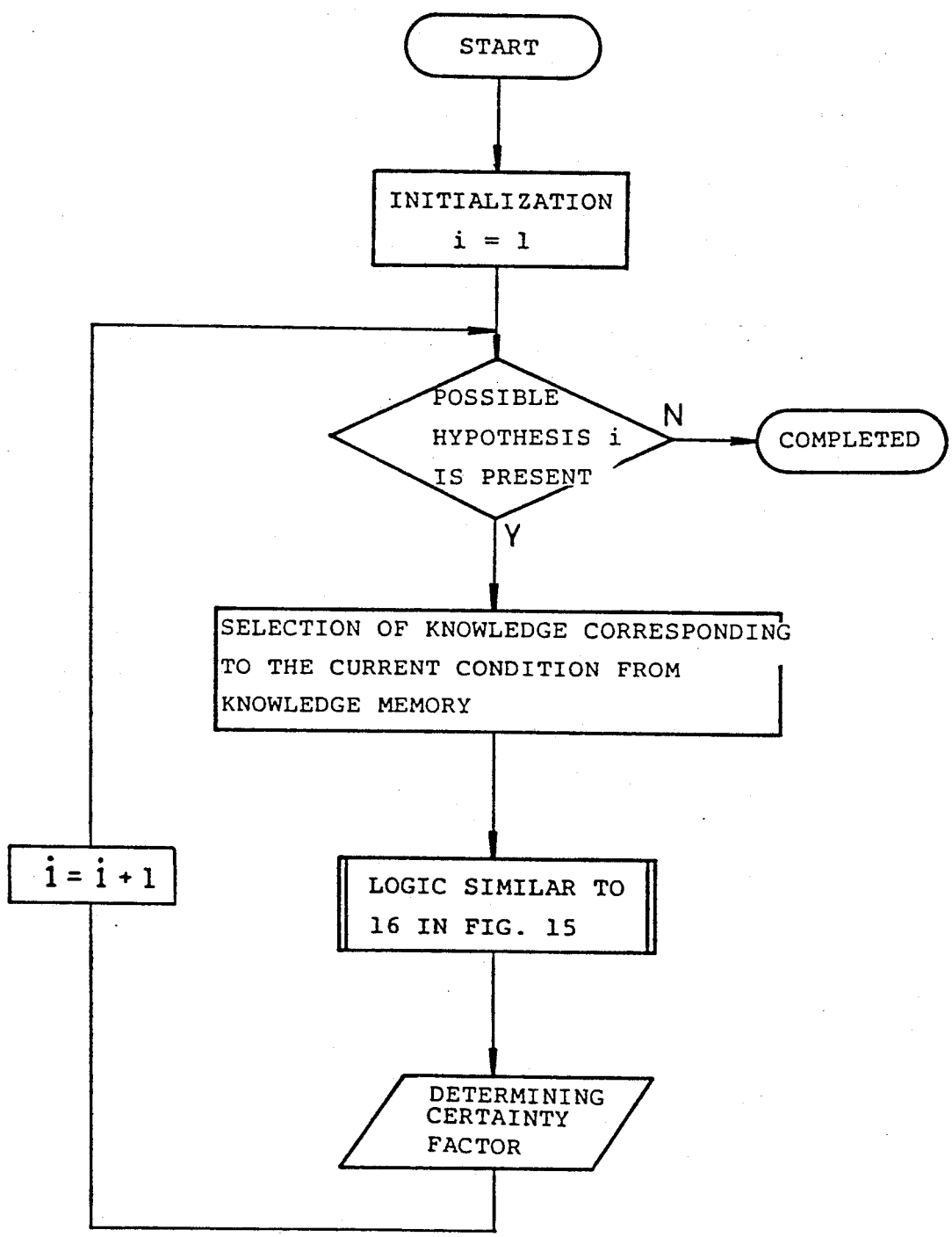
FIGS. 16 illustrates a process flow of the diagnosing portion of the above-described modified example.

FIG. 16 illustrates the flow when the operation of the second diagnosing portion 5 is treated by a computer. In the second diagnosing portion 5, the relationship between the hypothesis stored in the second knowledge memory 4 and the symptoms which correspond to the condition is selected, and the certainty factor of each of the hypothesis is calculated in a manner similar to the first diagnosing portion 2.

Although in the above-described description, the first and second knowledge memories and the first and second diagnosing portions are distinguished at use, only one knowledge memory and one diagnosing portion can display the similar result at the output display portion depending upon the capacity thereof.

The method of determining the certainty factor is not limited to the above-described embodiments, and other methods can be employed. Specifically, a method can be employed that is so arranged that a hypothesis is considered to be materialized if ten or more symptoms defined as the classification symbols A and B are appeared. Another method can be also employed that is so arranged that a hypothesis is considered to be materialized if the number of the non-appeared symptoms is less than 2 and simultaneously the symptoms defined as the classification symbols A and B exceeds 10.

Although, the description is made upon the case where the four classification symbols A to D are used, the number of the same may be less or more than four.

According to the first embodiment, the type and the cause of the generation of a fault can be displayed to an operator so that the operator can properly perform a judge in accordance with the classification of the symptom even if the symptom appearance possibility is different.

Figure 17:
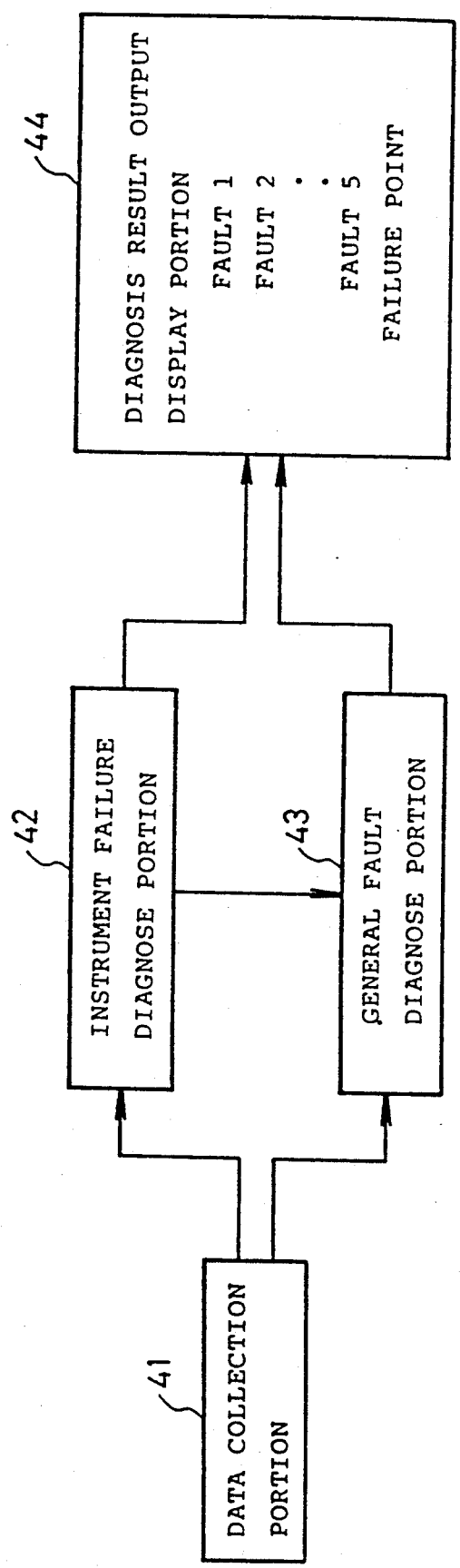
FIG. 17 illustrates a block diagram according to a second embodiment.

FIG. 17 is a block diagram illustrating a second embodiment of the present invention. Referring to this figure, reference numeral 41 represents a data collection portion, reference numeral 42 represents instrument failure diagnose portion consisting a diagnosing portion. Reference numeral 43 represents a general fault diagnose portion as well consisting the diagnosing portion, and reference numeral 44 represents a diagnosis result output display portion serving as an notifying means.

The above described data collection portion 41 collects process data from each of the instruments in the plant. The process data collected by this data collection portion 41 is input to the instrument failure diagnose portion 42 and the general fault diagnose portion 43. The instrument failure diagnose portion 42 diagnoses a fact whether there is a failure in the instrument or the like by using the process data collected by the data collection portion 41, and it outputs its diagnosis result upon the failure point to the general fault diagnose portion 43 and the diagnosis result output display portion 44. As a method of diagnosing the instrument failure, a method can be exemplified by a method in which the process data estimated from the material balance of the plant or heat balance is made comparison to the measured result by the instrument, or another method can be exemplified that such failure is diagnosed when the slight change of the measured value becomes zero through monitoring the measured values.

The general fault diagnose portion 43 diagnoses a fault other than the instrument failure by using the process data input from the data collection portion 41. It performs diagnosis by removing the process data for the instrument detected as failure by the instrument failure diagnose portion 42 from the process data collected by the data collection portion 41. The operation of the general fault diagnose portion 43 can be employed, for example, which is so arrange that it outputs a diagnosis result as that this diagnoses result has a poor reliability upon the diagnosis item diagnosed by using the process value measured by the failed instrument by way of replacing the failed instrument's process value by an estimated value obtained by using the relationship upon the material balance or the heat balance. Another operation can be also employed which is so arranged that it outputs the diagnosis result as that the diagnosis result upon the diagnosis item cannot be obtained when the process value measured by the failed instrument is difficult to be estimated, but this process value performs a critical role in the diagnosis. The output is, for example, in the form shown in FIG. 18.

According to the second embodiment, the process data collected by the data collection portion 41 is input to the instrument failure diagnose portion 42 and the general fault diagnose portion 43 so that the corresponding instrument failure and general fault are diagnosed. Even if an instrument failure is detected by the instrument failure diagnose portion 42, the general fault diagnose portion 43 performs the fault diagnosis by removing the process data of the instrument diagnosed as failure from the process data collected by the data collection portion 41. Therefore, an operator can be free from needless confusion.

Description will hereunder be given for a third embodiment according to the present invention. Before explanation is made upon the third embodiment, a floating time and urgency factor according to this embodiment will be described. Even if faults evenly have the same time left to generation of fault state, their floating times are different to each other depending upon the time required taken to avoid occurrence of the fault state. That is, a fault taking a rather long time period to avoid the fault state or restore a normal state is allowed a relatively short time since such fault needs to be early overcome. Therefore, the scale of such floating time can be expressed as follows:

$$\text{floating time} = (\text{time left to generation of abnormal state}) - (\text{time required to avoid abnormal state}) \quad (3)$$

Next, the urgency factor will now be described. In the fault having short floating time, there is a fault having low importance factor and low urgency factor or a fault having high importance factor capable of critically affecting an apparatus and the surrounding and thereby having high urgency factor. Therefore, the scale of the urgency factor of the fault can be expressed as follows:

$$\text{urgency factor} = G(I, t) \quad (4)$$

wherein
I: importance factor when alarm is issued
t: floating time for a certain alarm
G: importance factor function of a certain alarm upon a floating time, and it satisfies the following characteristics:

$$G(I_1, t) \geq G(I_2, t), \text{ however } I_1 \geq I_2$$

$$G(I, t_1) \geq G(I, t_2), \text{ however } t_1 \geq t_2$$

Figure 19:
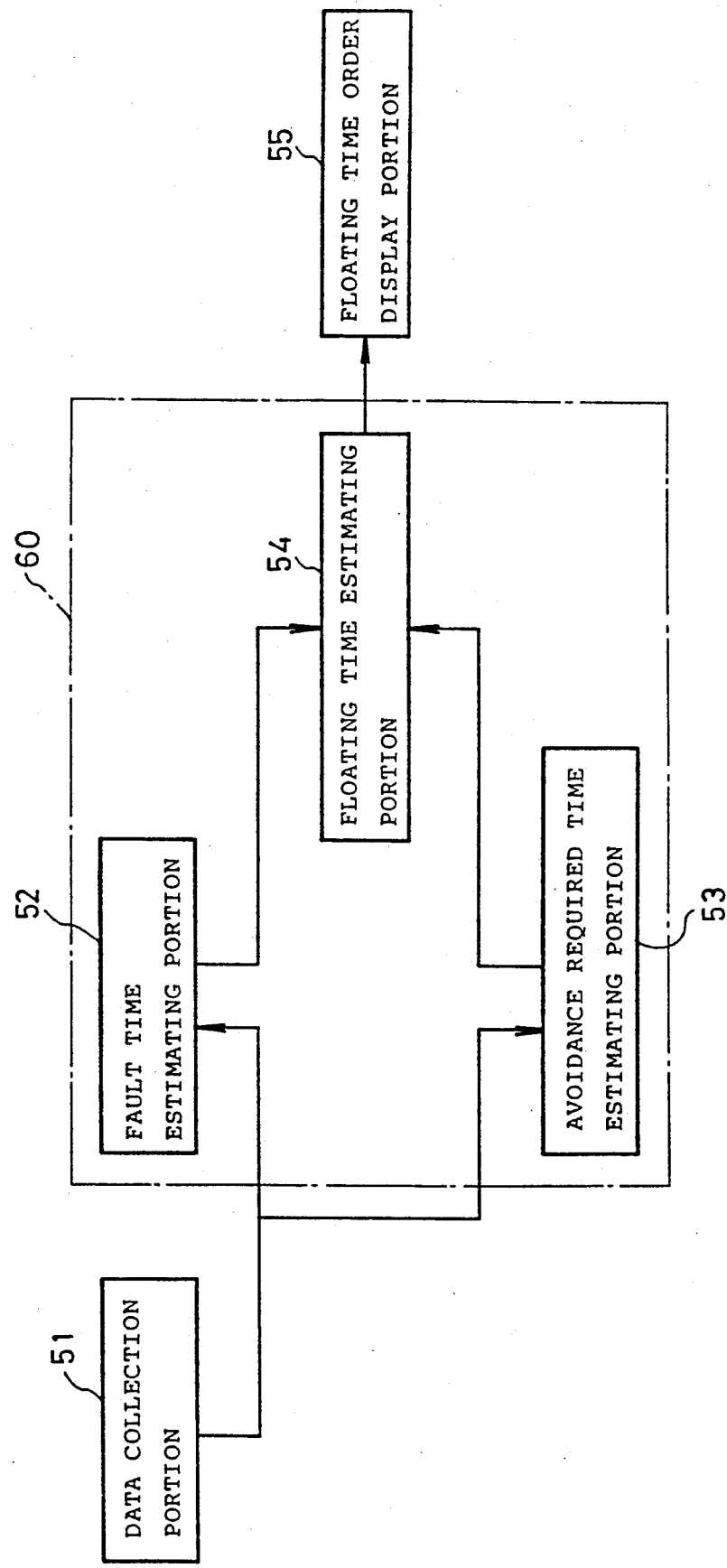
FIGS. 19 to 22 illustrate the basic system structure according to a third embodiment.

Referring to FIG. 19, reference numeral 51 represents a data collection portion, reference numeral 52 represents a fault time estimating portion, reference numeral 53 represents an avoidance required time estimating portion. Reference numeral 54 represents a floating time estimating portion, and reference numeral 55 represents a floating time order display portion. A diagnose portion 60 is constituted by the fault time estimating portion 52, avoidance required time estimating portion 53, and a floating time estimating portion 54.

The data collection portion 51 acts to measure and collect data on the physical quantity of each portion of each process in the instrumentation of, for example, a chemical plant. The fault time estimating portion 52 estimates the time taken of generation of a fault state upon an alarm item serving as a predetermined information for detecting fault or the like by using the physical properties of the process and the data collected by the data collection portion 51. The thus-estimated value is called an "estimated fault-generation time". The avoidance required time estimating portion 53 estimates the time taken to avoid the subject fault state upon each of the predetermined alarm item in accordance with the physical properties of the process and data collected by the data collection portion 51. The thus-estimated value is called a "estimated avoidance-required time". The floating time estimating portion 54 calculates the floating time defined by the above-described equation (3) The floating time order display portion 55 displays the alarm item successively starting from the alarm item having short floating time in accordance with the floating time calculated by the floating time estimating portion 54.

Figure 21:
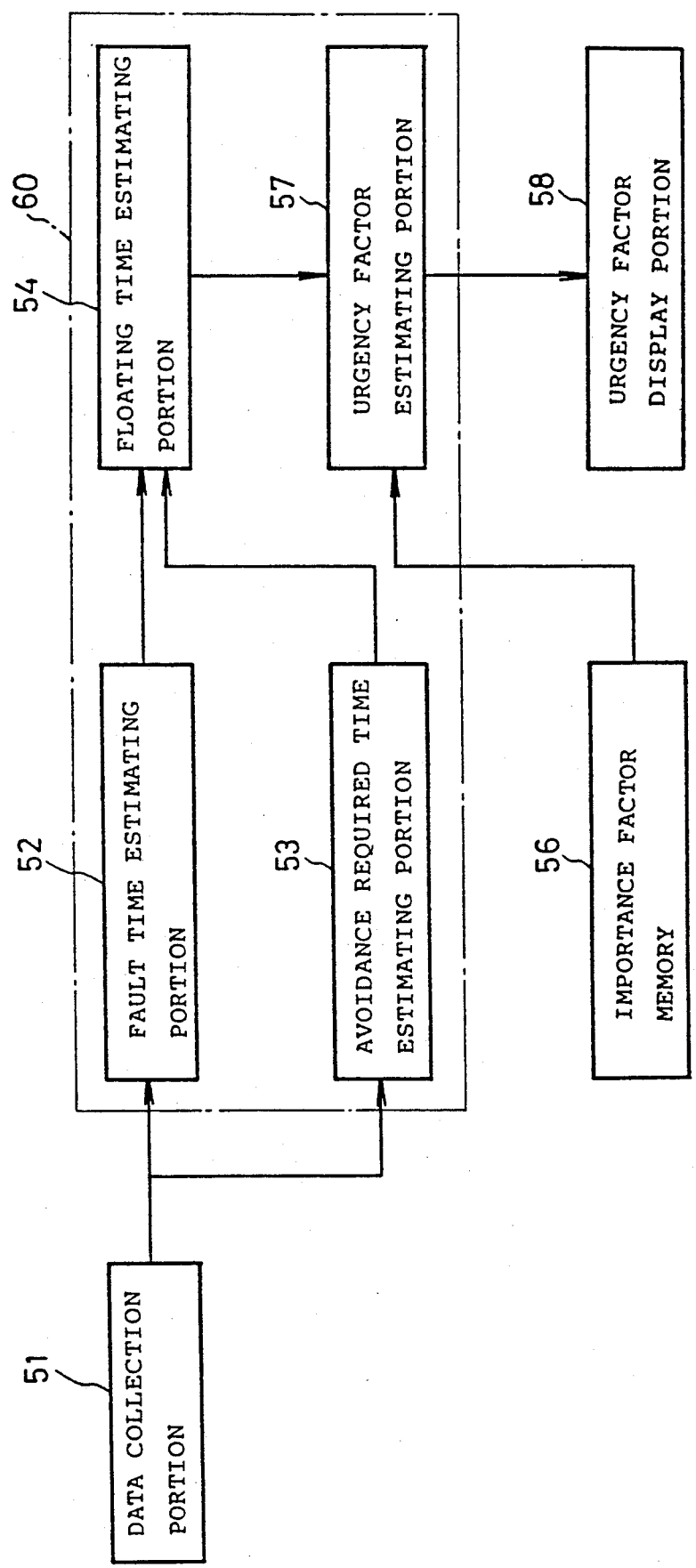

The structure shown in FIG. 21 will then be described. The same portions as those shown in FIG. 19 are given the same reference numerals, and the descriptions for them are omitted. Reference numeral 56 represents an importance factor memory, reference numeral 57 represents an urgency factor estimating portion, and reference numeral 58 represents an urgency factor display portion serving as a notifying means. A diagnose portion 60 is constituted by the fault time estimating portion 52, the avoidance required time estimating portion 53, the floating time estimating portion 54, and the urgency factor estimating portion 57. In this arrangement, the importance factor memory 56 previously stores the importance factor when the alarm is issued upon alarm items serving as information for detecting fault or the like. The urgency factor estimating portion 57 calculates, by using equation (4), the urgency factor by collating between the floating time calculated by the floating time estimating portion 54 and the importance factor when the alarm stored in the importance factor memory 56 is issued. The urgency factor display portion 58 displays successively starting from a fault state having the urgency factor in accordance with the urgency factor calculated by the urgency factor estimating portion 57.

By means of the above-described operation, the fault state which will be generated later having a rather short floating time or having a high urgency factor can be successively displayed. As a result of this, the instrumentation operator in, for example, a chemical plant, can previously acknowledge the fault state having short floating time or having a high emergency. It assists decision making at the time of taking a countermeasure against a fault generated. As a result of this, generation of faults in the instrumentation of the chemical plant due to the fault can be previously prevented.

Figure 20:
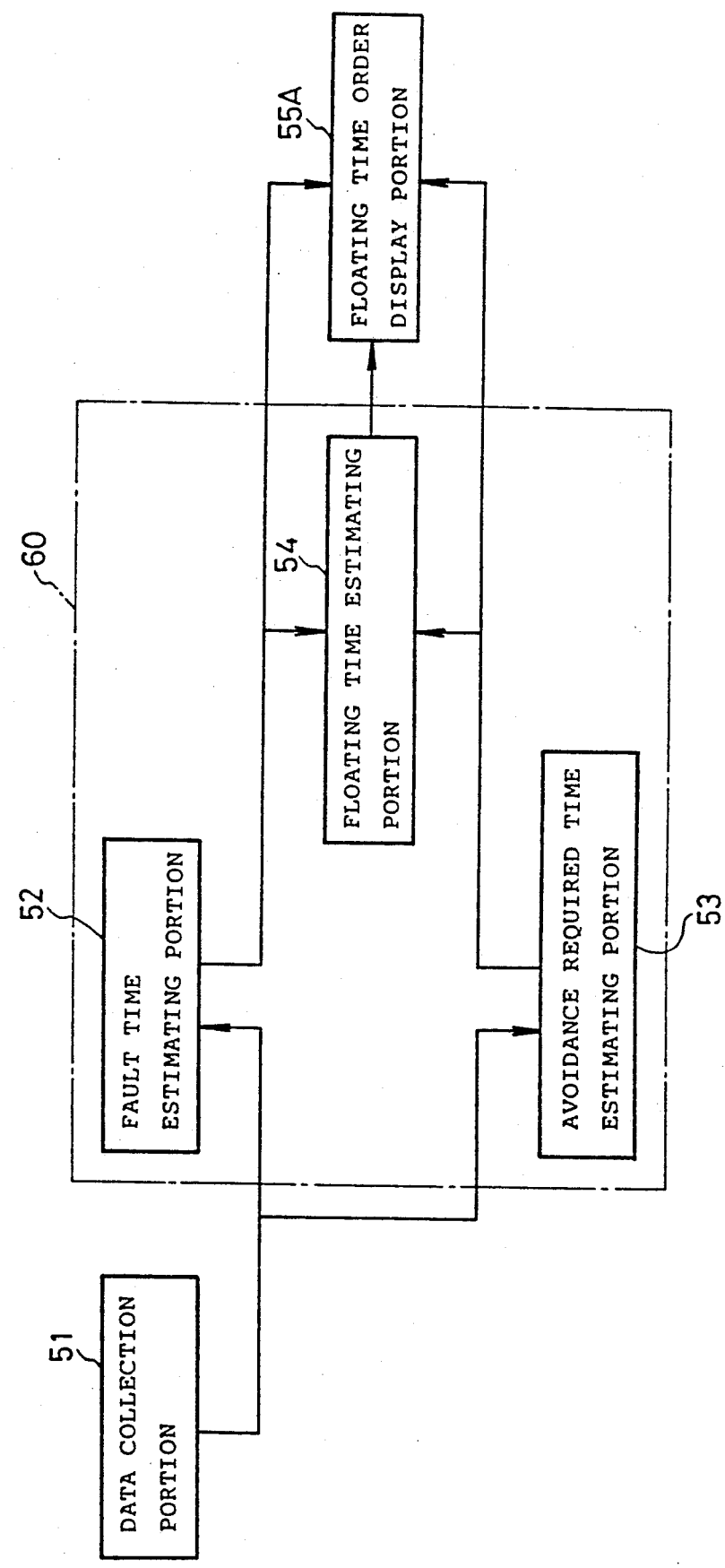

The floating time order display portion 55 can further conveniently notify the fault state by addition of factors to be displayed. FIG. 20 illustrates the structure of a system in this case. The same portion as those shown in FIG. 19 are given same reference numerals and their descriptions are omitted. In this structure, the floating time order display portion 55A is further provided with a time display function so that it displays the alarm factors stating from the alarm factor having a rather short floating time in accordance with the floating time calculated by the floating time estimating portion 54, and displays the estimated fault-generation time, the estimated avoidance-required time value and the estimated floating time depending upon each alarm factor. As a result of thus-performed display, because the absolute length of the floating time can be notified to humans and the estimated fault-generation time and the estimated avoidance-required time are displayed, the progress of the fault in the instrumentation of the chemical plant can be easily notified to humans.

Figure 22:
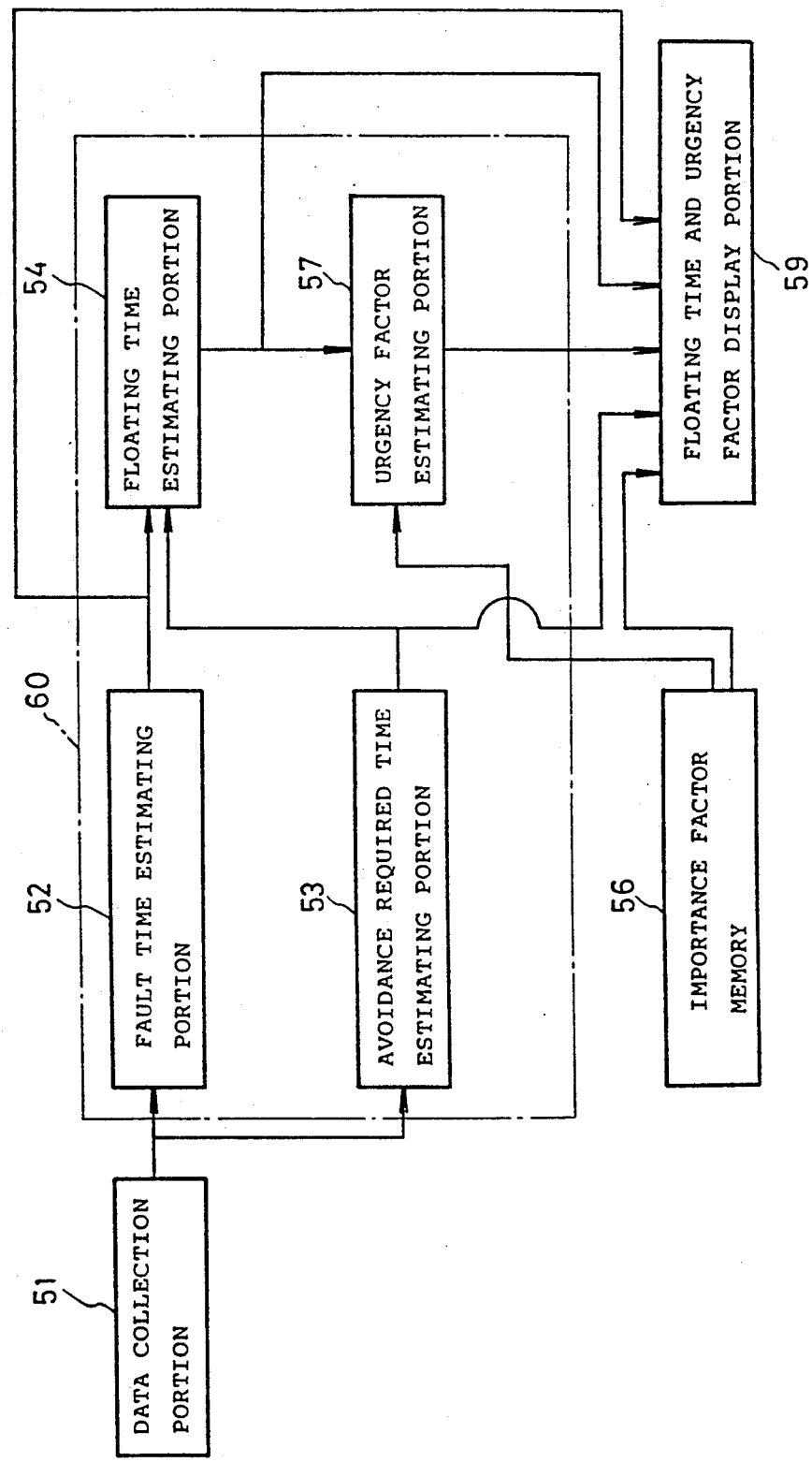

The urgency factor display portion 58 can be arranged to be further provided with factors to be displayed for the purpose of further convenient performing notification of the fault state. FIG. 22 illustrates the structure of a system for use in this case. The same portions as those shown in FIG. 21 are given the same reference numerals, and the description for them are omitted. In this structure, a floating time and urgency factor display portion 59 is further provided with a time display function and importance factor display function so that it can successively display alarm factor starting from that having a large urgency factor in accordance with the urgency factor calculated by the urgency factor estimating portion 57, and it can display the estimated fault-generation time, estimated avoidance-required time, estimated floating time and urgency factor upon alarm factor. As a result of the thus-performed display, not only the sequential order of the urgency factor of the fault state but also progress and importance factor of the fault state can be further easily noticed to humans by displaying the estimated fault-generation time, estimated avoidance-required time, estimated floating time and importance factor.

A specific example applied to the instrumentation of a chemical plant according to the third embodiment will be further in detail described.

Figure 23:
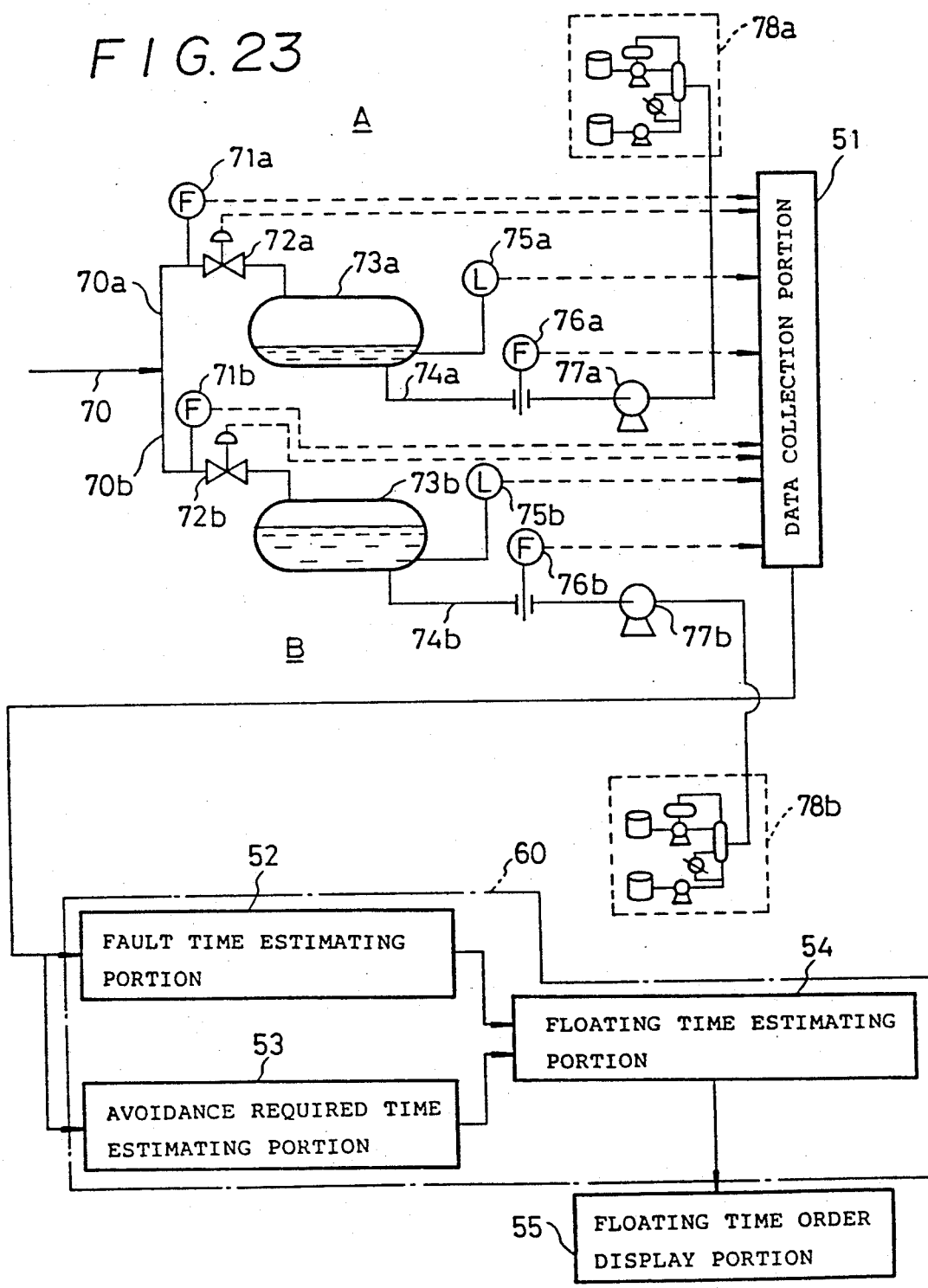
FIGS. 23 to 24 each illustrate different examples in which the above-described system is applied to the instrumentation of a chemical plant.

FIG. 23 illustrates a pump system serving as this specific example, in which a buffer chamber and a pump system are shown used in a case where fluid introduced into the system is branched into two systems. In this figure, reference numeral 70 represents an inflow pipe, reference numerals 71a and 71b represent inflow indicator connected to the branched inflow pipes 70a and 70b. Reference numerals 72a and 72b represent inflow valve, and reference numerals 73a and 73b represent buffer chambers connected to the inflow pipes 70a and 70b. Reference numerals 74a and 74b represent discharge pipes connected to the buffer chambers 73a and 73b, and reference numerals 75a and 75b represent level indicators for indicating the fluid level at the buffer cambers 73a and 73b. Reference numerals 76a and 76b represent discharge indicators connected to the discharge pipes 74a and 74b. Reference numerals 77aand 77b represent pumps connected to the discharge pipes 74a and 74b. These component elements constitutes a systems A and B.

The operation of the thus-constituted process will now be described. Fluid is introduced from the inflow pipe 70 into the inflow pipes 70a and 70b, and is passed through the inflow indicators 71a and 71b and the inflow valves 72a and 72b. Then the fluid is introduced into the buffer chambers 73a and 73b. The inflow indicators 71a and 71b measure the rate of the flow passing into the buffer chambers 73a and 73b. The inflow valves 72a and 72b controls the rate of the flow introduced into the buffer chambers 73a and 73b. The buffer chambers 73a and 73b temporarily retain the fluid. The fluid level in these buffer chambers 73a and 73b are measured by the level indicators 75a and 75b. The fluid in the buffer chambers 73a and 73b is discharged through the discharge pipes 74a and 74b, and is passed through the discharge indicators 76a and 76b. The fluid is then delivered to separating devices 78a and 78b for separating the fluid into a light weight ingredient and a heavy weight ingredient by pumps 77a and 77b. The discharge indicators 76a and 76b measure the flow rate passing through the discharge pipes 74a and 74b.

The fault diagnosing system according to the third embodiment is constituted for collecting data of the measured values from the above-described process by combining the inflow indicators 71a, 71b, inflow valves 72a and 72b, level indicators 75a and 76b and discharge indicators 76a and 76b.

The operation of each of the portions to which the system according to this embodiment in a case assumed that the inflow pipe 70 is clogged by foreign matters and the fluid rate passing from the inflow pipes 70 is thereby reduced will be described.

When the fluid rate supplied from the inflow pipe 70 is reduced, the quantity in the buffer chambers 73a and 73b is decreased assuming that the fluid quantity consumed in the lower stream portion of the subject process is not changed. Finally, the buffer chambers 73a and 73b become empty. As a result of this, the rate of the flow passing through the discharge pipes 74a and 74b is decreased, and fluid supplied by the pumps 77a and 77b to the following stream becomes increased, causing the fault to be propagated to the following streams. The time taken for the buffer chambers 73a and 73b to become empty can be calculated from equation (5) using each residual quantity of the fluid in the buffer chambers 73a residual quantity of and 73b and the rate of the flow passing through the discharge pipes 74a and 74b. The systems A and B respectively involves the different time.

$$Ti = Qi(Li)/(Foi-Fni) \quad (5)$$

wherein
  Ti: time (second) taken for the buffer chamber in an i system becomes empty
  Qi: residual quantity (m$^3$) of fluid in the buffer chamber in the i system, this quantity becoming a function of the residual fluid level Li in the buffer chamber
  Li: fluid level (%) in the buffer chamber in the i system
  Fni: rate (m$^3$/second) of the flow passing though the i system
  i=a or b, each corresponding to the system A or B As a means for preventing an exhaustion of the buffer chambers 73a and 73b, the quantity reduced due to the clogging of the inflow pipe 70 may be compensated by increase in the open degree of the inflow valves 72a and 72b for the purpose of reducing the pressure loss. As the time required to avoid the fault, it is sufficiently safety to use the time taken to fully open the inflow valves 72a and 72b from the open degree of the same. The time required to fully open the valves can be obtained, for example, from equation (6):

$$Tpi = Ai*(100-Mi) \quad (6)$$

wherein
  Tpi: time (second) taken to fully open the inflow valve in the system i A
  i: constant (second/%) determined by the characteristics of the valve
  Mi: open degree (%) of the inflow valve in the system i
  i=a or b, each corresponding to the system A or B.

In this system, (A) is arranged to display an exhaustion of the buffer chamber 73a, while (B) is arranged to display the fault of the exhaustion of the buffer chamber 73a. The operation of each of the portions will now be described.

The data collection portion 51 collects the measured value of each instrument, that is, the rate of the flow passing through the inflow indicators 71a and 71b, the fluid level of the level indicators 75a and 75b in the buffer chambers 73a and 73b, the rate of the flow passing through the discharge indicators 76a and 76b and the open degree of the inflow valves 72a and 72b. The fault time estimating portion 52 calculates the time taken for the fluid level in the buffer chamber to become zero, that is time Ti obtained from equation (5) so that this time is arranged to be the estimated value taken to generation of the fault.

The avoidance required time estimating portion 53 estimates the time required to take any avoidance measure, that is, it calculates Tpi given from equation (6) and makes this result as the estimated avoidance required time. The floating time estimating portion 54 subtracts the estimated avoidance required time from the estimated fault time upon the faults in each of the systems and it makes this subtraction result the floating time. That is, abnormal A calculates Ta−Tpa upon the exhaustion of the buffer chamber 73a. Fault B calculates the exhaustion of the buffer chamber 73b. The floating time order display portion 55 arranges the fault factors having a short floating time to be at high ranking, and it, for example, displays the fault in accordance with this ranking on a cathode rays display to notify it to humans.

In the thus-constituted embodiment, either of buffer chambers in two systems earlier generates a fault can be previously acknowledged by monitoring them always so that a danger can be avoided by first taking a certain measure for the system whose buffer chamber earlier becomes empty.

Figure 24:
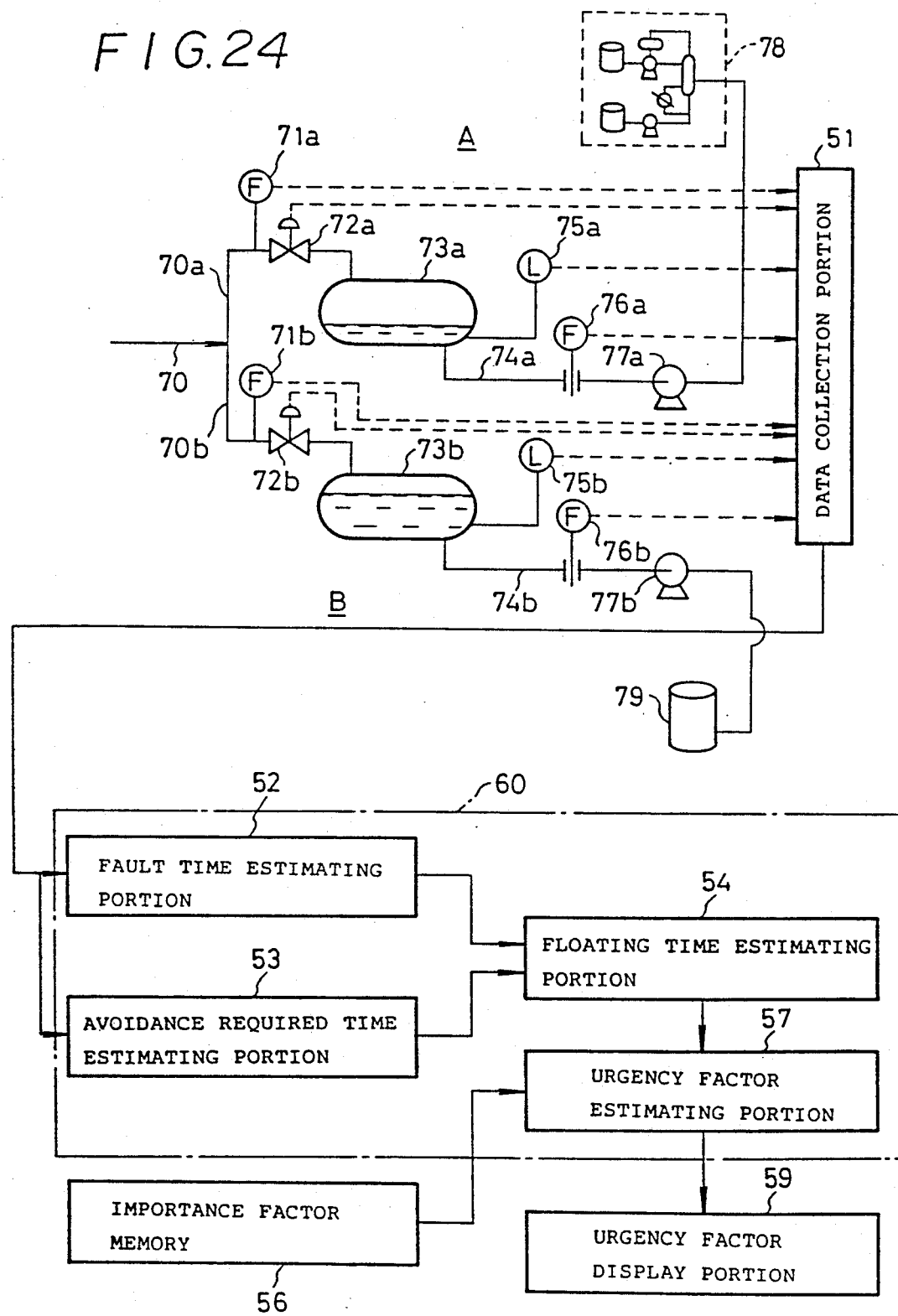

FIG. 24 illustrates another embodiment constituted by the system whose structures shown in FIG. 21 is combined.

FIG. 24 illustrates a buffer chamber and a pump systems with which the fluid introduced into these systems from inflow pipes are branched into two systems, and one of the two branches is directly supplied to the ensuing apparatus. The thus-formed system is arranged to be system A. Another flow is not directly supplied to the ensuing device, but is stored in a chamber. This system is arranged to be system B. The same portions as those shown in FIG. 23 are given the same reference numerals, and the descriptions for them are omitted. In this drawing, reference numeral 78 represents a device for fractionating the thus-branched fluid. Reference numeral 79 represents a chamber for storing the thus-divided fluid. Since the operation of the thus-constituted process only has a difference in the portion to which the fluid is supplied from the process shown in FIG. 23, its description is omitted.

The operation of each of the portions to which the system according to this embodiment is subjected will be described assuming a case in which the fluid quantity supplied from the inflow pipe 70 is reduced due to clogging generated in the inflow pipe 70 by a foreign matter. As described above, the floating time for fault A and the floating time for fault B are calculated. The importance factor when an alarm is issued is previously set in the importance factor memory 56 in accordance with the classification criterion shown in FIG. 25. In this example, even if the fault (A) is generated, the apparatus cannot be broken. However, there is the probability of a large change in the ensuing fractionating apparatus or a deterioration in the product quality. Therefore, its importance factor classification symbol corresponds to C. When the fault (B) is generated, the apparatus cannot be broken and there is the little provability of deterioration in the product quality. However, since a slight change can be generated, its importance factor classification symbol corresponds to D. The urgency factor estimating portion 57 estimates the urgency factor in accordance with the criterion shown in FIG. 26. In a case where the floating time for fault (A) is three minutes, while the floating time for fault (B) is two minutes, the urgency factor for the fault (A) is 4, while the same for the fault (B) is 5. Therefore, the faults (A) having high urgency factor are successively displayed on a display to notice it to humans.

As can be clearly seen from this embodiment, since the fault having an urgency factor is clearly displayed considering the floating time of exhaustion fault the buffer chambers of the two systems and the effect when this fault is generated by always monitoring the systems, it is clear for the operator to recognize the priority of the measures, therefore, the operator can properly takes a measure.

Next, a fourth embodiment of the present invention will now be described with reference to FIG. 27.

Figure 27:
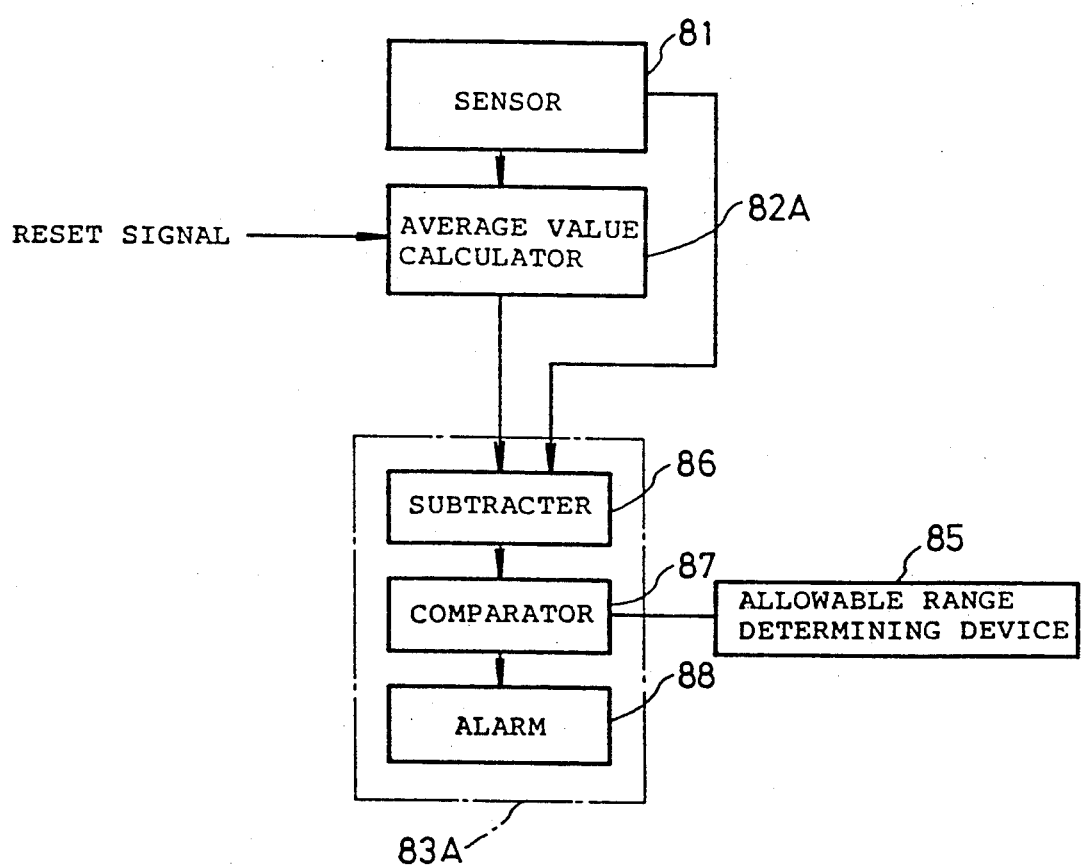
FIG. 27 illustrates the structure according to a fourth embodiment.

Referring to FIG. 27, this system comprises a sensor 81 such as a pressure gauge or a flow rate gauge for measuring the physical quantity of a specific point in the plant and for outputting its data. It further comprises an average value calculator 82A to which the output from the sensor 81 is input and calculating the average value of the physical quantity, and diagnose portion 83A to which the output from the average calculator 82A and the output from the sensor 81 are input, whereby the operating conditions of the plant is diagnosed by processing in a predetermined manner.

The average value calculator 82A is so arranged that the average value of the physical quantity in a time period which is immediately before a predetermined time period. The diagnosing portion 83A comprises a subtracter 86 for calculating the difference between the physical quantity at the specific point in the plant supplied from the sensor 81 and the average value supplied from the average value calculator 82A, and a comparator 87 for determining whether the difference obtained by the subtracter 86 is included in an allowable range which has been previously determined by an allowable range determining device 85. As a result of this, the diagnosing portion 83A can perform fault diagnosis, and as well it comprises an alarm 88 serving as a notifying means for issuing an alarm when the difference between the physical quantity and the average value is not included in the allowable range. In this case, the average value calculated by the calculator 82A is considered to be the stable value of the physical quantity.

The average calculator 82A is arranged in such a manner that reset signals can be supplied if necessary. As a result of this, it can correspond to the change in the physical quantity generated when the operating conditions of the plant are changed.

Therefore, according to the fourth embodiment, since the allowable range can be set only for the deviation from the stable state, a relatively narrow allowable range can be set. Therefore, the problem experienced with the conventional apparatus in which the allowable range needs to be set widely, that is, it takes a long time period for the change in the physical quantity due to the abnormality to exceed an allowable range can be overcome. Furthermore, since the average value serving as a reference value for a physical quantity in a stable state can correspond to the change in the process through a long time period, an effect can be obtained that it can flexibly corresponds to the process change.

Furthermore, the average calculator 82A is constituted in such a manner that reset signals can be supplied and the average value of the physical quantity is calculated again from the time point at which such reset signal is supplied. Therefore, even if the stable value of the physical quantity is changed due to the human factors such as change in the plant operating conditions, it can correspond to such change.

A modified examples of the fourth embodiment will now be described with reference to FIGS. 28 to 31. The same components parts as those in the fourth embodiment are given the same reference numerals, and the descriptions for them are omitted.

Figure 28:
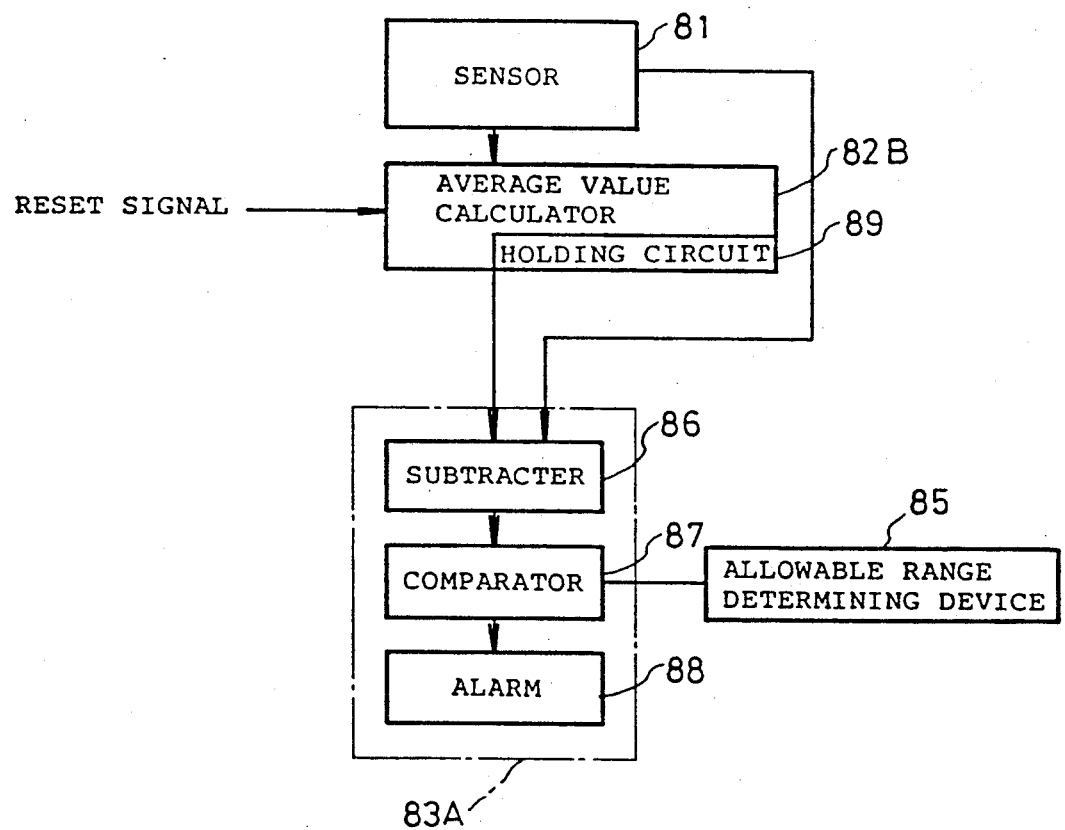
FIGS. 28 to 31 each illustrate modified examples of the fourth embodiment.

The modified example shown in FIG. 28 is characterized in that a hold circuit 89 is provided for the average calculator 82B. This hold circuit 89 acts not to renew the average value of the physical quantity when the alarm 88 issues an alarm in the immediately previous time range.

Therefore, according to the modified example, in addition to the effect obtained from the above-described embodiment, a further effect can be obtained that a rather reliable alarm can be obtained since it becomes to use only the stable value of the physical quantity when the plant is normally operated can be used by arranging the system in which the average value of the physical quantity when any fault is detected in the plant is not used.

Figure 29:
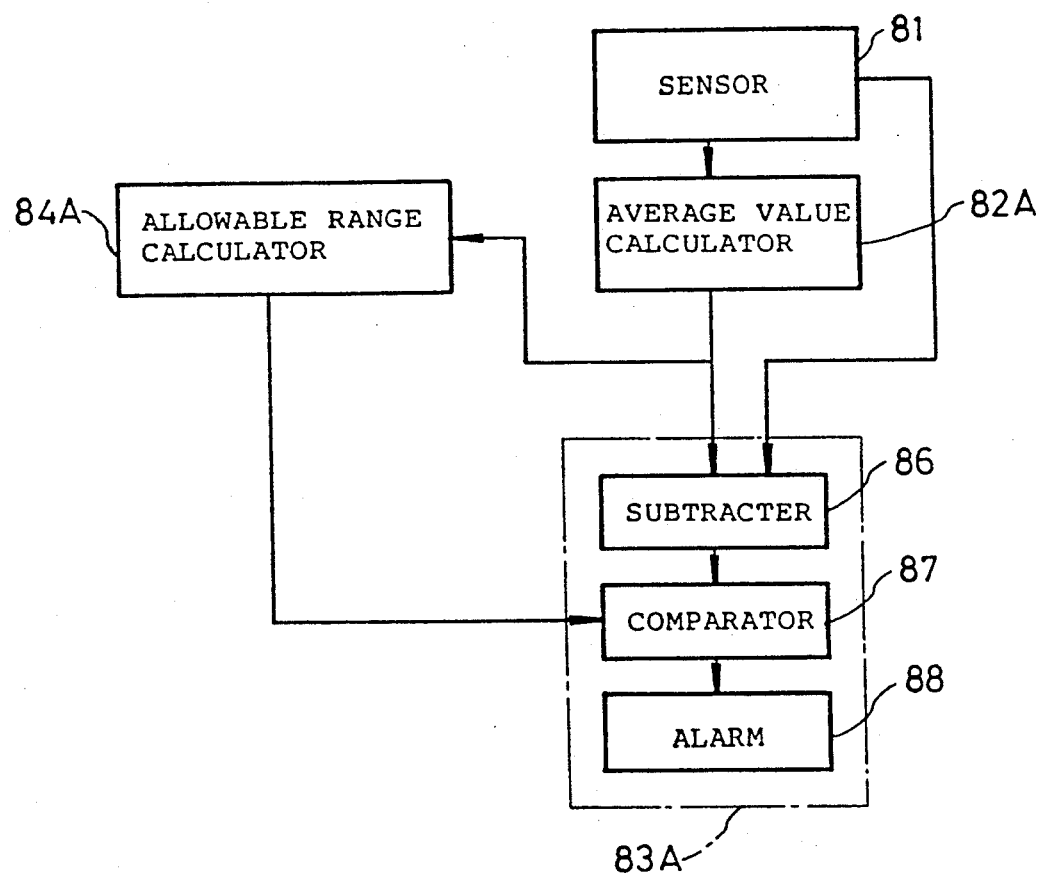

FIG. 29 illustrates the other modified example. This modified example is characterized in that the difference between the physical quantity measured by the sensor 81 and the average value of the physical quantity calculated by the average value calculator 82A, that is the range in which deviation distributes, is statistically calculated. Therefore, an allowable range calculator 84A is as well provided between the average value calculator 82A and the comparator 87.

In this embodiment, assuming that the distribution of the above-described change is the normal distribution, the region in which the deviation distributes can be determined statistically from the following equation:

$$m = \sum_{i=1}^{N} X(i)/N \qquad (7)$$

$$\sigma = \sum_{i=1}^{N} (X(i) - m)^2/(N - 1) \qquad (8)$$

wherein

X (i): value measure of physical quantity at time point i

N: the number of samples for the subjected physical quantity m: average value of the physical quantity $\sigma$: the standard deviation of X A: allowable range of the deviation Assuming that the distribution of X is a normal distribution, the deviation is present in the probability 99% or more by making $A = \pm 3\sigma$. Therefore, by using this value for A as the allowable range, the fault of the physical quantity can be detected without any erroneous alarm is issued even when it is a normal or a stable state.

Furthermore, the allowable range for the deviation can be automatically determined and the allowable width deviated from the value at the normal operation can be automatically and significantly easily determined. Therefore, many labors required in the conventional system can be reduced to a considerable extent.

Figure 30:
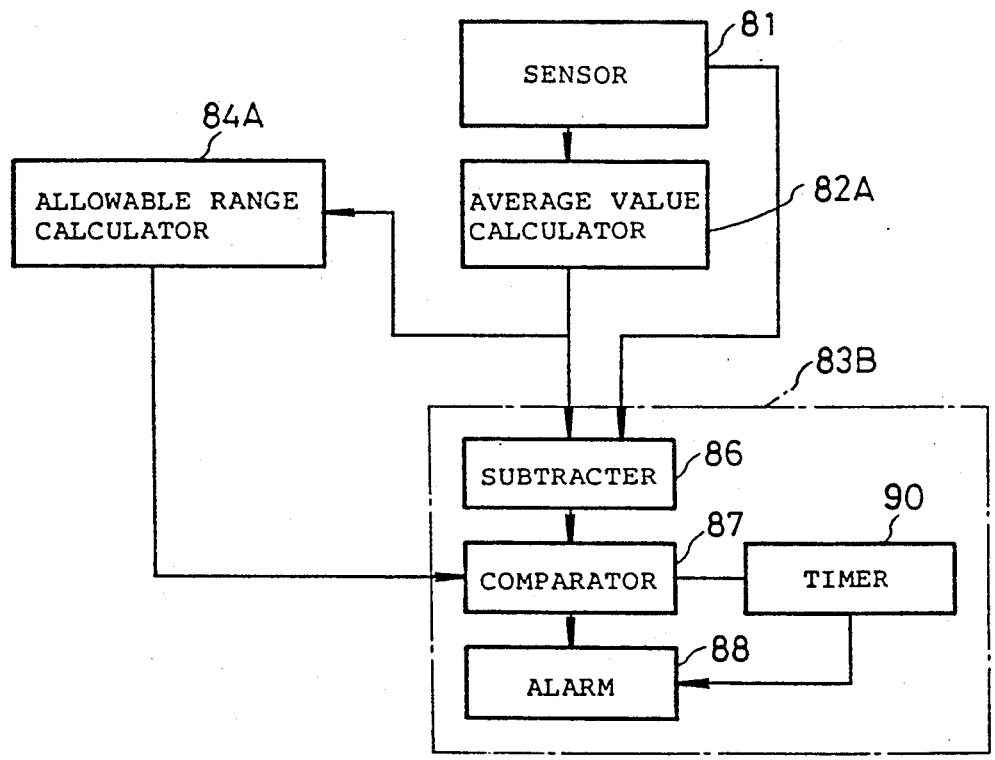

A modified example shown in FIG. 30 will now be described. The diagnosing portion 83B according to this modified example is characterized in that it is constituted in such a manner that an alarm is issued provided that the deviation between the physical quantity and the average value deviates for a predetermined continued time period. Furthermore, a timer 90 is included.

This timer 90 is constituted in such a manner that it counts a timing when a signal representing generation of a deviation from an allowable range is input from the comparator, and outputs a signal demanding the operation of the alarm 88 to the alarm 88 when the deviation continues for a predetermined time period.

According to the thus-constituted example, an effect can be further obtained that an issue of alarm can be prevented in a case where the change in the measured physical quantity is due to any disturbance such as an accidental noise or the like so that needless confusion can be prevented.

Figure 31:
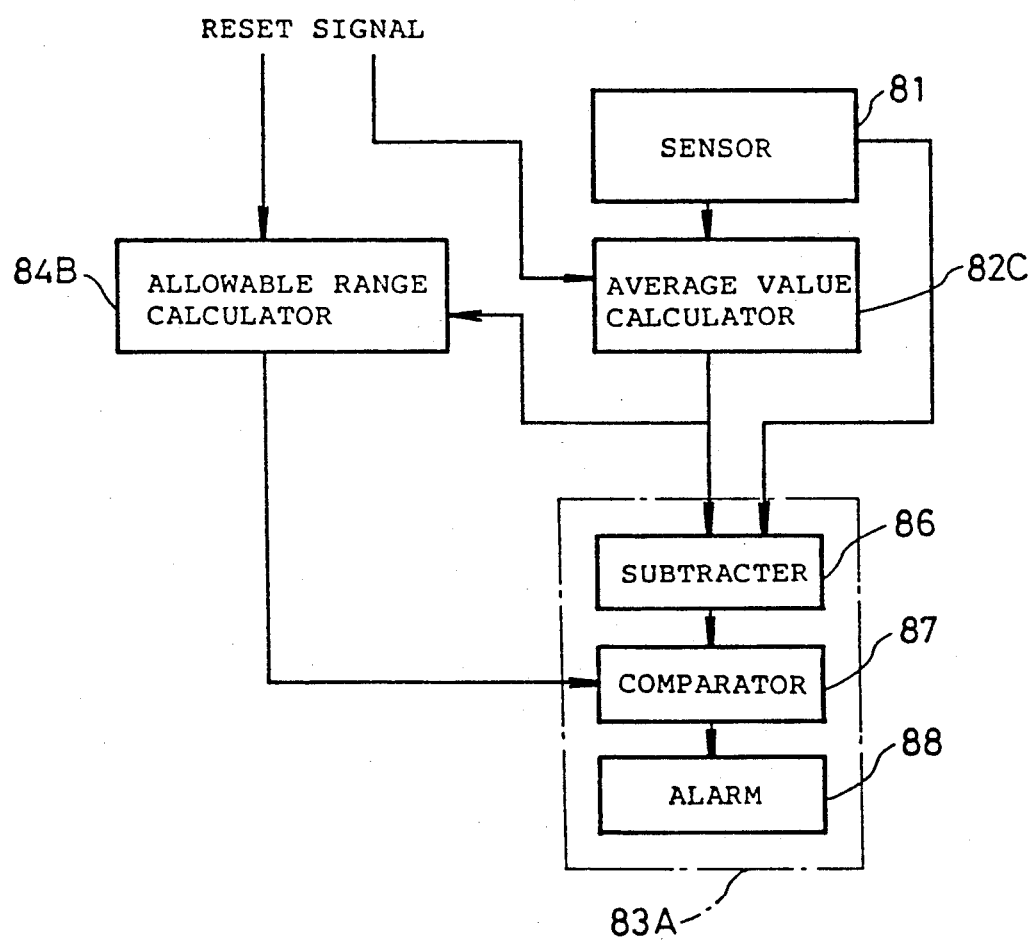

FIG. 31 illustrates the other modified example. This modified example is characterized in that it is constituted in such a manner that reset signals can be intentionally supplied to the average value calculator 82C and allowable range calculator 84b so that the average value and the allowable range are calculated and renewed by using data which is the physical quantity from receipt of these reset signals.

Therefore, according to the thus-constituted example, the average value of the physical quantity at the stable point intentionally changed and the deviation can be newly calculated, and the range in which the deviation is present corresponding to the operating conditions can be automatically determined. As a result of this, a fault detection having a wide applicability to various plants can be performed.

The plant fault diagnosing system according to the fourth embodiment and its modified examples are not limited to the case where the fault in the instrumentation in plants is directly detected and it is displayed. Its diagnosis result can become the reference when the diagnosis pattern according to the first embodiment is processed. That is, when a fact that any fault is generated in the plant is diagnosed by the diagnose portions 83A and 83B, its diagnosis result is employed as the diagnosing pattern and as well the operating conditions or the like for the each portion of the plant are employed as the diagnosing pattern.

Although the sensor 81 comprises a pressure gauge and flow rate gauge, but it can be applied to various types of instrumentations widely used in plants.

As described above, according to the present invention, a fault diagnosing system can be provided with which faults and operating conditions of a plant can be early detected and monitored, and as well a reliable diagnosis result can be obtained. Furthermore, a countermeasures to always maintain the operating conditions of the plant can be taken by issuing an alarm or the like depending upon the diagnosis result.

What is claimed is:

1. A plant fault diagnosing system, comprising: instrumentation means for providing process data representing physical operational characteristics of a plant process, diagnosing means for diagnosing faults in the plant in accordance with a relationship between said process data and at least one of predetermined information regarding fault diagnosis and a changeable reference value based on said process data, said diagnosing means including means for generating a diagnosing pattern which symbolically represents said process data;

means for displaying the diagnosis given by said diagnosing means;

a memory for storing said predetermined information and also for outputting said predetermined information to said diagnosing means, said predetermined information including importance factors which define the relative importance of the diagnosed faults;

said diagnosing means including means for estimating a first amount of time which will elapse between the diagnosis and the actual occurrence of each fault based upon the physical properties of the plant process and said process data, means for estimating a second amount of time required to avoid the occurrence of the fault, means for subtracting said second amount of time from said first amount of time to thereby calculate an estimated floating time available before a fault avoidance operation should begin, and means for calculating an urgency factor based on said estimated floating time and said importance factor; and said displaying means including means for ranking and displaying the faults in sequential order based upon respective magnitudes of said urgency factor and said floating time.

2. The plant fault diagnosing system according to claim 1, wherein said diagnosing means includes instrument failure diagnosing means for diagnosing a failure of said instrumentation means, and general fault diagnosing means for diagnosing abnormalities other than the failures of said instrumentation means by ignoring process data associated with any failure of said instrumentation means as detected by said instrument failure diagnosing means.

3. The plant fault diagnosing system according to claim 1, including an average value calculator connected to said diagnosing means and having means for calculating an average value of said process data over a predetermined time interval, said average value of said process data being said changeable reference value, wherein said diagnosing means includes means for calculating the difference between said average value and said process data, said diagnosing means having means for issuing an alarm when said difference deviates from a predetermined allowable range, and said average value calculator having holding circuit means for preventing calculation of said average value during any time period when said alarm is being issued.

4. The plant fault diagnosing system according to claim 3, including an allowable range calculator connected to said diagnosing means and having means for calculating a statistical region where said difference between said average value and said process data is distributed and for determining said allowable range based on said statistical region.

5. The plant fault diagnosing system according to claim 4, including means for applying reset signals to said average value calculator and said allowable range calculator, said calculators having respective means responsive to said reset signals for causing said average value and said allowable range to be calculated again by using process data from a time point at which said reset signals are supplied.

6. The plant fault diagnosing system according to claim 3, including means for applying a reset signal to said average value calculator, said average value calculator having means responsive to said reset signal for causing said average value to be calculated again by using process data from a time point at which said reset signal is supplied.

7. The plant fault diagnosing system according to claim 3, wherein said diagnosing means includes means for processing said diagnosing pattern by using the alarm.

8. The plant fault diagnosing system according to claim 1, including an average value calculator which is connected to said diagnosing means and includes means for calculating an average value of said process data over a predetermined time interval, said average value of said process data being said changeable reference value, wherein said diagnosing means includes means for calculating the difference between said average value and said process data, and means for issuing an alarm when the difference between said average value and said process data deviates from a predetermined allowable range for a predetermined continued time period.

9. The plant fault diagnosing system according to claim 1, including an average value calculator connected to said diagnosing means and having means for calculating an average value of said process data over a predetermined time interval, said average value of said process data being said changeable reference value, wherein said diagnosing means includes means for calculating the difference between the average value and the process data, and means for issuing an alarm when said difference deviates from a predetermined allowable range, and said diagnosing means including means for processing said diagnosing pattern by using said alarm.

10. The plant fault diagnosing system according to claim 1, including knowledge memory means for supplying said predetermined information regarding fault diagnosis to said diagnosing means, said predetermined information representing possible faults and symptoms associated with said possible faults, said possible faults being classified in said knowledge memory means according to one of the likelihood and intensity of occurrence of said symptoms in conjunction with each said possible fault.

11. The plant fault diagnosing system according to claim 10, wherein said diagnosing means includes means for relating said process data to said predetermined symptom information and for thereby classifying an actual fault in the plant as one of said possible faults represented by said predetermined information.

12. The plant fault diagnosing system according to claim 1, wherein said displaying means includes means for displaying each of said importance factor, said urgency factor, said first and second amounts of time, and said floating time.

13. A fault diagnosing system for diagnosing faults in an operative target system, comprising:
 data collection means for collecting data representing a physical operational state of the target system;
 diagnosing means for interpreting said data and determining on the basis thereof whether said data indicates that a fault will occur in the target system, said diagnosing means including fault time estimating means for estimating a first amount of time which will elapse between said indication of said fault and an actual occurrence of said fault in the target system, avoidance time estimating means for estimating a second amount of time which will be required for taking corrective action to avoid the occurrence of said fault, and floating time estimating means for subtracting said second amount of time from said first amount of time to thereby calculate an estimated floating time available before said corrective action should begin; and
 display means for displaying faults indicated by said data, including ranking means for ranking said faults for display based on the magnitudes of their respective floating times.

14. The fault diagnosing system according to claim 13, wherein said display means includes further means for displaying each of said first amount of time, said second amount of time, and said floating time associated with each indicated fault.

* * * * *